US012146938B2

(12) United States Patent
Christoffers et al.

(10) Patent No.: US 12,146,938 B2
(45) Date of Patent: Nov. 19, 2024

(54) RF-DAC DIGITAL SIGNAL MODULATION

(71) Applicant: Infineon Technologies AG, Neubiberg (DE)

(72) Inventors: Niels Christoffers, Vienna (AT); Sanaz Hadipour Abkenar, Linz (AT); Soumya Krishnapuram Sireesh, Linz (AT); Christoph Wagner, Enns (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 749 days.

(21) Appl. No.: 17/397,271

(22) Filed: Aug. 9, 2021

(65) Prior Publication Data

US 2021/0373145 A1 Dec. 2, 2021

Related U.S. Application Data

(63) Continuation-in-part of application No. 16/167,925, filed on Oct. 23, 2018, now Pat. No. 11,086,004.

(51) Int. Cl.
G01S 13/34 (2006.01)
G01S 13/32 (2006.01)
G01S 13/36 (2006.01)
H03M 1/06 (2006.01)

(52) U.S. Cl.
CPC .......... *G01S 13/343* (2013.01); *G01S 13/325* (2013.01); *G01S 13/36* (2013.01); *H03M 1/0668* (2013.01)

(58) Field of Classification Search
CPC ...... G01S 13/343; G01S 13/325; G01S 13/36; H03M 1/0668
See application file for complete search history.

(56) References Cited

PUBLICATIONS

Indra ("FPGA-based I/Q chirp generator using first quadrant DDS compression for pulse compression radar", AIP Conference Proceedings 1755, 170005 (2016); https ://doi.org/10.1063/1.4958607 Jul. 21, 2016 (Year: 2016).*

* cited by examiner

*Primary Examiner* — Timothy A Brainard
*Assistant Examiner* — Helena H Seraydaryan
(74) *Attorney, Agent, or Firm* — Cooper Legal Group LLC

(57) ABSTRACT

Radar frequency range signals (e.g., 1 to 100 gigahertz) are often generated by upconverting a reference frequency to a transmission frequency, and a received signal may be downconverted to analyze information encoded on the transmission via modulation. Modulation may be achieved via a fractional frequency divider in a phase-locked loop, but fractional spurs may reduce the signal-to-noise ratio. Additionally, the ramp slope may vary due to phase-locked loop momentum. Instead, a clock generator may generate clock signals for a digital front end comprising a digital signal modulator that generates modulated digital values comprising quadrature representations of a radar modulation signal, which are encoded by a radiofrequency digital-to-analog converter (RF-DAC). The RF-DAC analog signal may be upconverted to a radar frequency and transmitted. A receiver may receive, downconvert, and analyze a reflection of the radar transmission, e.g., to perform range detection based on a frequency ramp encoded by the radar transmission.

20 Claims, 24 Drawing Sheets

RF-DAC DIGITAL SIGNAL MODULATION

RELATED APPLICATION

This application claims priority to and is a continuation-in-part of U.S. application Ser. No. 16/167,925, filed on Oct. 23, 2018, entitled "RF-DAC DIGITAL SIGNAL MODULATION", which is incorporated by reference herein in its entirety.

TECHNICAL FIELD

The present disclosure relates to the field of signal processing and particularly to the modulation of radar signals.

BACKGROUND

Within the field of signal processing, many scenarios involve the generation, transmission, detection, and/or analysis of signals in the radar frequency range, such as 1 gigahertz to 100 gigahertz. Signals in this range may be produced by generating a reference frequency using an oscillator, such as a crystal or a digitally controlled oscillator (DCO), and by applying frequency upconversion, e.g., by mixing a signal at an initial (low) frequency with a mixing frequency to produce a higher-frequency signal at approximately the sum of the initial frequency and the mixing frequency. Applying a number of frequency upconversion stages may enable a translation of the reference frequency signal to a radar frequency signal, which may be amplified by a power amplifier and transmitted via an antenna. In a corresponding manner, a radar signal detected at a radar frequency may be received and translated through a number of downconversion stages, e.g., by mixing a signal at an initial (high) frequency and a mixing frequency to produce a lower-frequency signal at approximately the difference of the initial frequency and the mixing frequency. The downconversion may enable the received signal to be translated to a low frequency that is suitable for analysis.

In many scenarios, the generated signal encodes information through modulation, such as amplitude modulation, frequency modulation, and/or phase modulation. The radar transmission provides a carrier for the information at a radar frequency range, and the received signal may be translated to a lower frequency to enable detection of the information encoded by the radar carrier signal. As an example application, radar signals are often used for range detection, e.g., by transmitting a radar signal, receiving a reflection of the transmitted radar signal, and multiplying the transmission time-of-flight with the transmission speed through the medium. When the radar signal is transmitted continuously, correlating the transmitted periodic signal with the received reflection of the periodic signal depends upon signal modulation. One such modulation technique is frequency-modulated continuous-wave (FMCW) radar ranging, in which the frequency of the transmitted radar signal ramps over a frequency range. Correlating the ramping frequency of the transmitted with the ramping frequency of the received signal enables a precise time-of-flight determination and a correspondingly precise range determination.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method is provided for detecting a range at a radar frequency. The method comprises performing a translation of a timing signal into an analog signal by generating, according to the timing signal, a first digital value and a second digital value based upon a random phase value, and translating the first digital value and the second digital value with a radiofrequency digital-to-analog converter to generate the analog signal, wherein the first digital value and/or the second digital value correspond to a quadrature representation of a radar modulating signal. The method comprises applying the translation to generate a transmission signal at the radar frequency. The method comprises combining the transmission signal and a received signal comprising a reflection of the transmission signal to determine the range.

In an embodiment, a ramp generator device is provided that comprises a phase-locked loop that provides a timing signal. The ramp generator device comprises a clock generator that translates the timing signal into a plurality of clock signals comprising one or more first clock signals and one or more second clock signals. The ramp generator device comprises a digital ramp generator that, using the one or more first clock signals, generates a first digital value and a second digital value based upon a random phase value, wherein the first digital value and/or the second digital value correspond to a quadrature representation of a ramp modulation signal. The ramp generator device comprises a radiofrequency digital-to-analog converter that, using the one or more second clock signals, converts the first digital value and the second digital value to produce an analog radiofrequency signal comprising a frequency ramp.

In an embodiment, a method is provided for detecting a range at a radar frequency. The method comprises performing a translation of a timing signal into an analog signal by generating a first cyclic digital value, truncating, using a first quantizer, first bits indicative of the first cyclic digital value to second bits indicative of a first truncated cyclic digital value, generating a first digital value based upon a first quantization error of the first quantizer and a second value, combining the first digital value with the first truncated cyclic digital value to generate a third digital value, generating, according to the timing signal, a fourth digital value based upon the third digital value, generating a second cyclic digital value, truncating using a second quantizer, third bits indicative of the second cyclic digital value to fourth bits indicative of a second truncated cyclic digital value, generating a fifth digital value based upon a second quantization error of the second quantizer and a sixth value, combining the fifth digital value with the second truncated cyclic digital value to generate a seventh digital value, generating, according to the timing signal, an eighth digital value based upon the seventh digital value, and translating the fourth digital value and the eighth digital value with a radiofrequency digital-to-analog converter to generate the analog signal, wherein the fourth digital value and/or the eighth digital value correspond to a quadrature representation of a radar modulating signal. The method comprises applying the translation to generate a transmission signal at the radar frequency. The method comprises combining the transmission signal and a received signal comprising a reflection of the transmission signal to determine the range.

In an embodiment, a ramp generator device is provided that comprises a phase-locked loop that provides a timing signal. The ramp generator device comprises a clock generator that translates the timing signal into a plurality of clock signals comprising one or more first clock signals and one or more second clock signals. The ramp generator device comprises a digital ramp generator that, using the one or more first clock signals, generates a first digital value and a second digital value. The digital ramp generator comprises a first quantizer that truncates first bits indicative of a first cyclic digital value to second bits indicative of a first truncated cyclic digital value, a first noise shaping module that generates a third digital value based upon a first quantization error of the first quantizer and a fourth value, a first combination module that combines the third digital value with the first truncated cyclic digital value to generate a fifth digital value, a second quantizer that truncates third bits indicative of a second cyclic digital value to fourth bits indicative of a second truncated cyclic digital value, a second noise shaping module that generates a sixth digital value based upon a second quantization error of the second quantizer and a seventh value, and a second combination module that combines the sixth digital value with the second truncated cyclic digital value to generate an eighth digital value. The first digital value is based upon the fifth digital value. The second digital value is based upon the eighth digital value. The first digital value and/or the second digital value correspond to a quadrature representation of a ramp modulation signal. The ramp generator device comprises a radiofrequency digital-to-analog converter that, using the one or more second clock signals, converts the first digital value and the second digital value to produce an analog radiofrequency signal comprising a frequency ramp.

In an embodiment, a method is provided for detecting a range at a radar frequency. The method comprises performing a translation of a timing signal into an analog signal by generating, according to the timing signal, a first digital value and a second digital value that are quadrature representations of a radar modulating signal, and translating the first digital value and the second digital value with a radiofrequency digital-to-analog converter to generate the analog signal. The method further comprises applying the translation to generate a transmission signal at the radar frequency. The method further comprises comparing the transmission signal and a received signal comprising a reflection of the transmission signal to determine a range.

In an embodiment, a radar modulation signal generator is provided that comprises a phase-locked loop that provides a timing signal. The radar modulation signal generator further comprises a clock generator that translates the timing signal into a first clock signal and a second clock signal. The radar modulation signal generator further comprises a digital signal modulator that, at the first clock signal, generates a first digital value and a second digital value that are quadrature representations of a modulation signal at a modulation frequency. The radar modulation signal generator further comprises a radiofrequency digital-to-analog converter that, using the second clock signal, converts the first digital value and the second digital value to produce a radiofrequency signal. The radar modulation signal generator further comprises a transmitter that generates a transmission signal at the radar frequency based on the radiofrequency signal. The radar modulation signal generator further comprises a receiver that receives a reflection of the transmission signal. The radar modulation signal generator further comprises a range determiner that compares the reflection and the radiofrequency signal to determine a range.

In an embodiment, a ramp generator device is provided that comprises a phase-locked loop that provides a timing signal. The ramp generator device further comprises a clock generator that translates the timing signal into a first clock signal and a second clock signal. The ramp generator device further comprises a digital ramp generator that, at the first clock signal, generates a first digital value and a second digital value that are quadrature representations of a ramp modulation signal. The ramp generator device further comprises a radiofrequency digital-to-analog converter that, using the second clock signal, converts the first digital value and the second digital value to produce an analog radiofrequency ramp signal.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
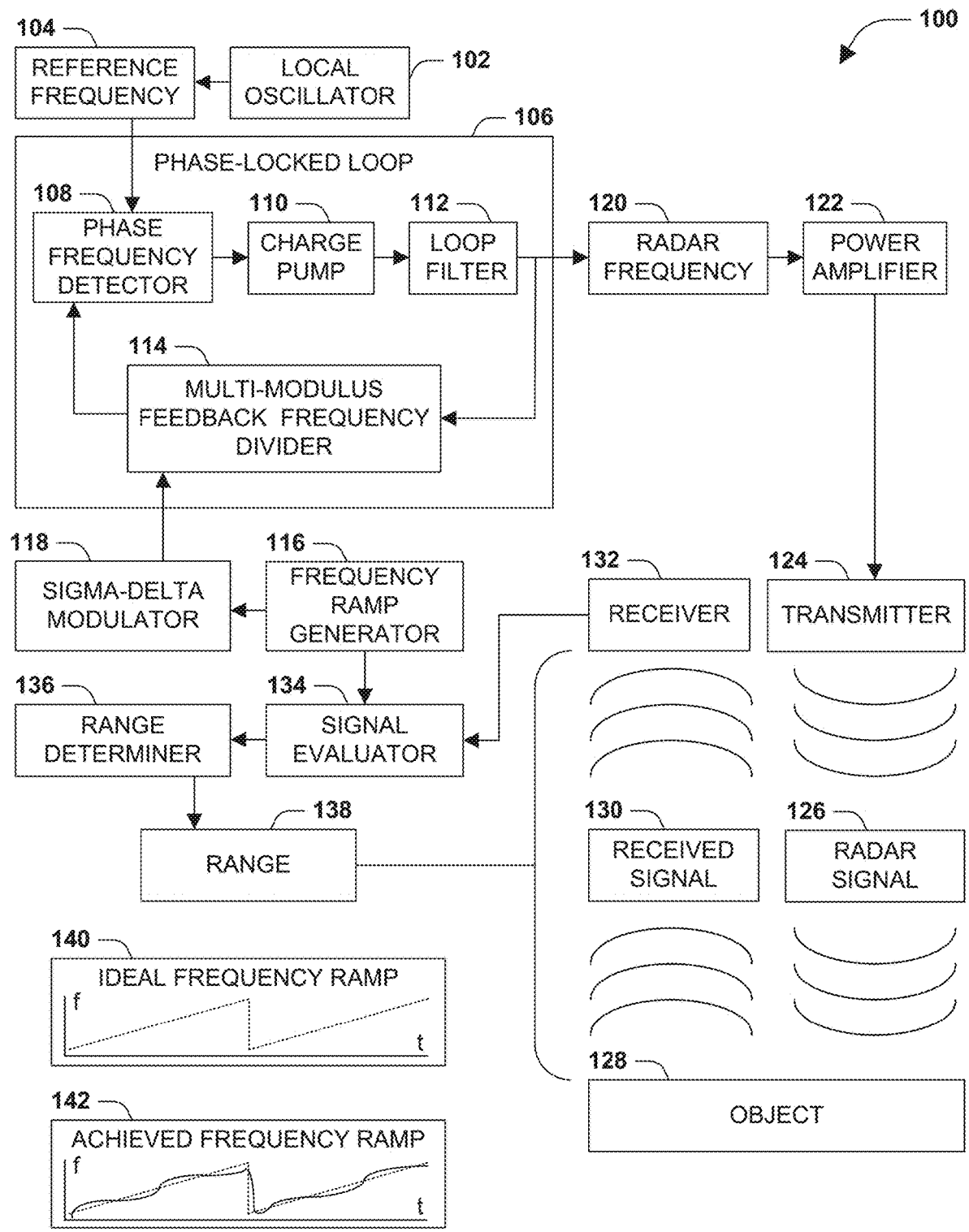
FIG. 1 is an illustration of an example scenario featuring a generation and transmission of a frequency-modulated radar signal and the detection of a reflected signal to determine a range to an object.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

A. INTRODUCTION

In the field of signal processing, many scenarios involve a generation, transmission, detection, and/or processing of an electromagnetic signal in a radar range of frequencies, such as 1 gigahertz to 100 gigahertz. The signal may be generated by an oscillator at a reference frequency and then upconverted, using a variety of techniques such as mixing, to a radar frequency that is power-amplified and transmitted by an antenna. During the signal generation process, a form of modulation may be applied to adjust the radar signal, which is embedding a variable element that serves as information to be transmitted by a carrier at the radar frequency. As some examples, the modulation may comprise frequency modulation over a frequency range; amplitude modulation over an amplitude range; and/or phase modulation over the phase of a periodic signal. The transmission at the radar frequency may be detected by a receiving antenna, downsampled to a frequency that is amenable to processing, and evaluated to detect the modulation of the signal that conveys the transmitted information.

FIG. 1 is an illustration of an example scenario 100 in which a radar signal is used to determine a range 140 between a transmitter 124 and receiver 132 and an object 128 that reflects the radar signal 126, and wherein the range 140 is determined based on a time-of-flight measurement and the speed of the radar signal 126 in the medium between the transmitter 124 and the object 128. In many such scenarios, the radar signal 126 is continuous and periodic, and in addition to receiving a received signal 130 that comprises a reflection of the radar signal 126, a range detector must be able to correlate the periodic cycles of the received signal 130 with the transmitted periodic cycles. One such technique is frequency-modulated continuous-wave (FMCW) radar ranging, in which a periodic radar signal 126 is transmitted continuously, but where the frequency is steadily increased over an increasing frequency ramp and a decreasing periodicity. The frequency of the received signal 130 may then be correlated with the frequency of the transmitted radar signal 126 to determine the time-of-flight of the radar signal 126. Such techniques permit the radar signal 126 to be transmitted continuously, resulting in high-resolution sampling of the time-of-flight that permits a precise determination of the range 140 of the object 128 and optionally other properties such as velocity, acceleration, direction, and distinguishing reflections of objects 128 from false positives and noise.

As further depicted in the example scenario 100 of FIG. 1, the generation of the radar signal 126 includes the modulation of the signal to generate the frequency ramp in the following manner. A local oscillator 102, such as a crystal oscillator or a voltage-controlled oscillator (VCO), produces a reference frequency 104 that is provided to a phase-locked loop 106. A multi-modulus feedback frequency divider 114 switches at a selected switching schedule to alter the phase of the reference signal (e.g., inverting the signal while switched) to approximate a higher-frequency signal. A phase frequency detector 108 receives both the reference frequency 104 and the switched output of the multi-modulus feedback frequency divider 114 and detects a difference in phase, and a charge pump 110 provides a voltage offset that translates the reference frequency 104 based on a phase difference. The mixing of the reference frequency 104 with the output of the multi-modulus feedback frequency divider 114 imposes images of the reference frequency 104 at multiple image frequencies, and a loop filter 112 (e.g., a bandpass filter) attenuates the images at undesired frequencies to produce an output signal at the higher frequency selected by the multi-modulus feedback frequency divider 114. One or more stages of further upconversion, such as mixing with higher-frequency signals, may further elevate the frequency of the generated signal to a radar frequency 120, such as 1 gigahertz to 100 gigahertz, which may be amplified by a power amplifier 122 and transmitted by a transmitter 124 such as an antenna.

The modulation of the radar signal in this pathway is achieved by control of the multi-modulus feedback frequency divider 114, which enables the switching to occur at a selectable fraction of the period of the reference frequency 104. The selection is achieved by a frequency ramp generator 116 that generates a steadily increasing value, such as a digital counter, and a sigma-delta modulator that signals the multi-modulus feedback frequency divider 114 when an integration of the steadily increasing value exceeds a delta threshold relative to the previous signal. The integration of the steadily increasing value causes the sigma-delta modulator to signal the multi-modulus feedback frequency divider 114 at an increasing rate, thereby gradually increasing the switching schedule and gradually increasing the frequency of the produced radar frequency 120 by incremental fractions of the reference frequency 104. The frequency ramp produced by the frequency ramp generator 116 may increase over a frequency range and may periodically reset.

The modulation of the radar signal with the frequency ramp may aid the evaluation of the received signal 130 and the determination of the range 140 in the following manner. The received signal 130 may be received by a receiver 132, such as a receiving antenna and downconverted from the radar frequency 120 to a frequency range that is amenable to further evaluation. The downconverted signal is processed by a signal evaluator 134 that correlates the frequency of the received signal 130 with the frequency of the frequency ramp generator 116. A range determiner 136 may determine a distance to an object detected by the range determiner and a speed of the object. Additionally, the components of the transmitter 124 and the components of the receiver 132 may operate at a high sampling rate to provide a precise series of range measurements, which may serve to verify the range 138; to detect the range 138 with high precision; to detect changes in the range 138 indicating the velocity, acceleration, and/or direction of the object 128; and/or to distinguish the detection of the object 128 from false detection, such as due to noise, interference, and/or signal imaging.

In this manner, the switching of the multi-modulus feedback frequency divider 114 by the frequency ramp generator 116, at an incrementally increasing fraction of the period of the reference frequency 104, enables frequency modulation of the radar signal 126 that approximates an ideal frequency ramp 140. However, several properties of this technique may cause the achieved frequency ramp 142 to diverge from the ideal frequency ramp 140. As a first example, the imposition of the modulation by the phase frequency detector 108 and the charge pump 110 exhibits a delay as the modulation signal propagates through the phase-locked loop; i.e., the phase frequency detector 108 and the charge pump 110 gradually adjust the momentum of the reference frequency 104 toward the instantaneous value of the ideal frequency ramp 140. As a result of the momentum of the phase-locked loop 106, the achieved frequency ramp 142 tends to cycle between overshooting the ideal frequency ramp 140 and undershooting the ideal frequency ramp 140. The discrepancy may diminish the precision of the correlation achieved by the signal evaluator 134, and thus the achievable precision of the time-of-flight determined by the time-of-flight determiner 136 and the range 140 determined by the range determiner 138. As a second example, the fractional switching of the multi-modulus feedback frequency divider 114 introduces discontinuities, which appear as fractional spurs in the frequency spectrum of the modulated radar frequency 120. The power of the fractional spurs can significant enough reduce the signal-to-noise ratio of the radar signal 126. The incidence and magnitude of fractional spurs may be reduced by operating the frequency ramp generator 116 at a lower ramping frequency; however, the reduced precision of the frequency ramp may exacerbate the discrepancy between the ideal frequency ramp 140 and the achieved frequency ramp 142, thereby further diminishing the achievable precision of the range determination. As a third such example, the correspondence between the frequency of the local oscillator 102 and the frequency of the resulting radar signal 126 may increase the power of frequencies around the frequency of the resulting radar signal 126. Such "pulling" effects may embody noise that diminishes the signal-to-noise ratio of the radar signal 126, and may be difficult to attenuate due to the proximity of the frequency of the pulled noise to the frequency of the radar signal 126. These and other disadvantages may result from the modulation of the radar signal 126 as a fractional adjustment of the reference frequency 104 by the multi-modulus frequency divider 114 as demonstrated in the example scenario 100 of FIG. 1.

B. PRESENTED TECHNIQUES

The currently presented techniques provide an alternative form of radar signal modulation, such as a frequency ramp over a frequency range. In accordance with the present disclosure, rather than directly producing a modulated radar frequency 120, a phase-locked loop 106 may instead generate a series of clock signals at a fixed frequency for a digital front end that generates a digital signal modulation, such as a digital frequency ramp. The digital signal modulator may operate at a first clock frequency and produce digital representations of the radar modulating signal in quadrature, which may be translated by a radiofrequency digital-to-analog converter (RF-DAC) operating at a second clock frequency to produce an analog signal 220 incorporating the modulation produced by the digital signal modulator. The analog output of the RF-DAC may be upconverted to the radar frequency range and transmitted as a radar frequency that exhibits the modulation generated by the digital signal modulator and the RF-DAC.

Figure 2:
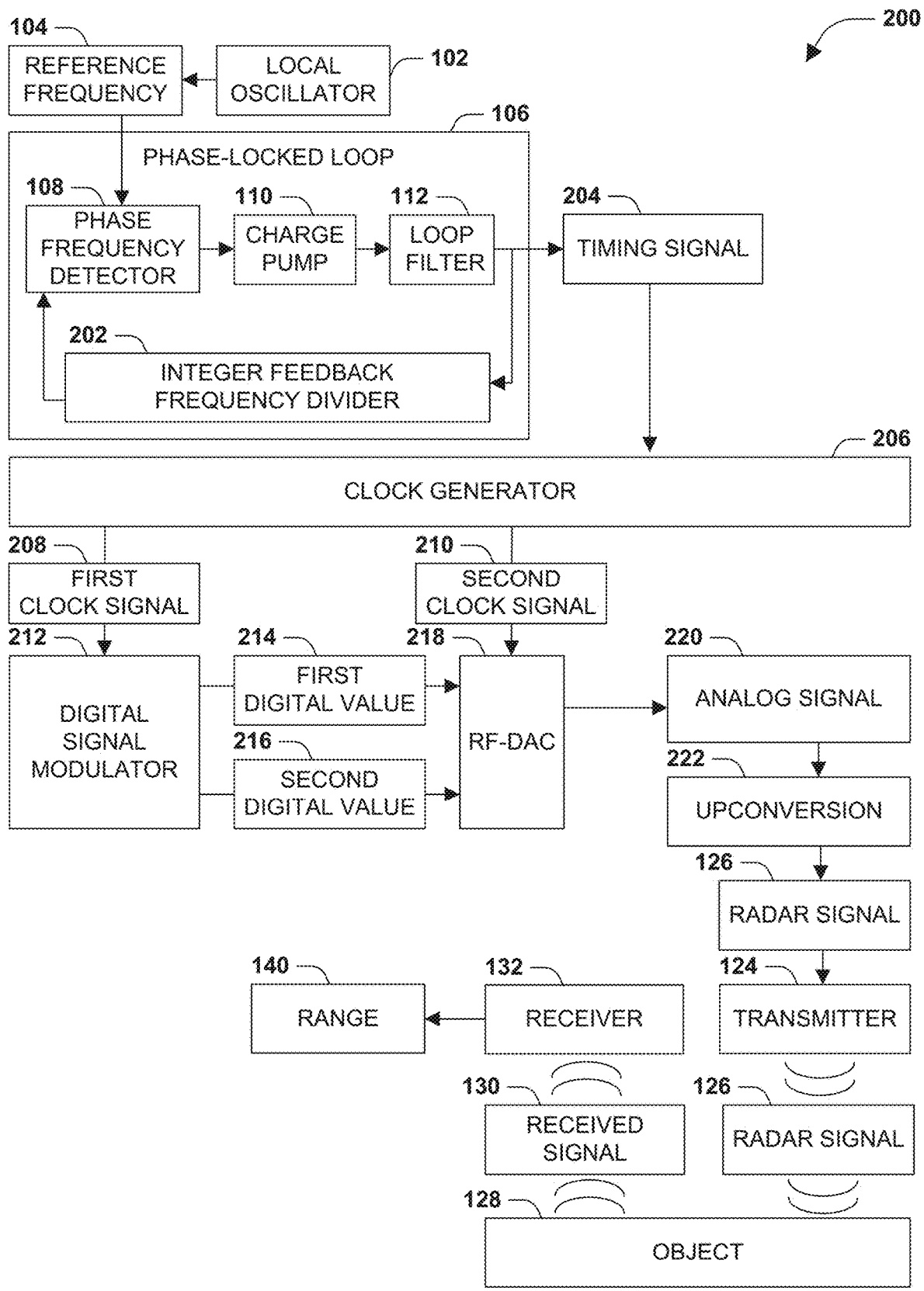
FIG. 2 is an illustration of an example scenario featuring a generation and transmission of a frequency-modulated radar signal and the detection of a reflected signal to determine a range to an object in accordance with the techniques presented herein.

FIG. 2 is an illustration of an example scenario 200 featuring a modulation of a radar signal 126 in accordance with the techniques presented herein. In this example scenario 200, a local oscillator 102 (such as a crystal oscillator or a voltage-controlled oscillator) provides a reference frequency 104 to a phase-locked loop 106 comprising a phase frequency detector 108, a charge pump 110, and a loop filter 112, as well as a feedback signal that provides an upconverting frequency modulation. However, rather than a multi-modulus feedback frequency divider 114 that switches at a schedule at a fluctuating fraction of the period of the reference frequency 104, the phase-locked loop 106 in the example scenario 200 of FIG. 2 comprises an integer feedback frequency divider 202 that provides switches at a static integer. The output of the phase-locked loop 106 is a timing signal 204 for a clock generator 206, which translates the timing signal into a first clock signal 208 and a second, higher-frequency clock signal 210. The clock generator 206 may include multiple frequency dividers to provide the first clock signal and second clock signal at frequencies lower than the timing signal 204. A digital signal modulator 212 operates at the first clock signal 208 to produce a digital signal as a first digital value 214 and a second digital value 216 that comprise quadrature representations of the signal to be transmitted. Moreover, the digital signal modulator 212 imposes a modulation on the signal. As an example, the digital signal modulator 212 may comprise a frequency ramp generator that generates an incrementally increasing value and an integrator that produces cyclic output representing the instantaneous phase of the signal, such as output over the range of 0 to 360 degrees or $2\pi$ radians, where the per-sample increase of the cyclic output by the integrator gradually increases to reflect a steadily increasing frequency of the signal and to achieve a digital frequency ramp. The cyclic output of the integrator may be processed by a coordinate rotation digital generator (a CORDIC generator) that produces the first digital value as sine and cosine representations of the cyclic output of the integrator, which may be processed by an I-section and a Q-section of an RF-DAC 218. As will be described later on, the DAC 218 may include a first DAC to convert the signal input to the I Section to an analog signal and a second DAC to convert the signal input to the Q Section to an analog signal. The DAC 218 may further include a combiner to combine (sum) the analog output signals provided by the first and second DAC to the analog signal 220.

The analog signal 220 produced by the RF-DAC 218 may be upconverted 222, such as through mixing (optionally by higher-frequency clock signals produced by the clock generator 206), to produce a radar signal 126 that is in the radar frequency range, such as 1 gigahertz to 100 gigahertz. The radar signal 126 is transmitted by a transmitter 124, such as a power amplifier and a transmitting antenna, and is reflected by an object 128. The reflection of the radar signal 126 is detected by a receiver 132, such as a receiving antenna, and the received signal 130 is further downconverted and processed (e.g., by a signal evaluator 134, a time-of-flight determiner 136, and a range determiner 138) to determine the distance traveled by the radar signal 126 from the transmitter 124 to the object 128 and back to the receiver 132, and therefore the range 140 between the transmitter 124 and receiver 132 and the object 128. In this manner, the radar signal 126, modulated with a frequency ramp by the interoperation of the phase-locked loop 106, the clock generator 206, the digital signal modulator 212, and the RF-DAC 218, enables radar range detection in accordance with the techniques presented herein. Transmit and receive antennas may be implemented in some embodiments in one antenna.

C. TECHNICAL EFFECTS

Some embodiments of the modulation of a radar signal 126 in accordance with the techniques presented herein may enable a variety of technical features with respect to other embodiments that do not use the techniques presented herein.

A first technical effect that may be exhibited by a radar signal 126 modulated in accordance with the techniques presented herein involves the avoidance of fractional spurs introduced by the fractional switching schedule of the multi-modulus feedback frequency divider 114. Rather than switching the reference frequency 104 at a variable switching schedule and with a variable fraction of the period of the reference frequency 104, the phase-locked loop 106 in the example scenario 200 of FIG. 2 operates at a relatively fixed frequency as provided by the integer feedback frequency divider 202, which is not responsible for creating modulation such as a frequency ramp, but only for upconverting the reference frequency 104 to the desired frequency of the timing signal 204. The selection of the switching schedule of the integer feedback frequency divider 202 as an octave of the reference frequency 104 may avoid the imposition of fractional spurs.

A second technical effect that may be exhibited by a radar signal 126 modulated in accordance with the techniques presented herein involves the correspondence of the modulation with respect to an ideal modulation, such as the correspondence between an achieved frequency ramp 142 with an ideal frequency ramp 140. A digital signal modulator 212 and RF-DAC 218 may impose a modulation on the signal that is not subject to the feedback delay and momentum characteristics of the phase-locked loop 106, but rather may apply the phase shift representing an incremental frequency increase of the frequency in the digital values generated for the RF-DAC 218. The resulting modulation, such as a frequency ramp 142, may therefore exhibit an achieved frequency ramp 142 with attenuated overshoot and undershoot. For example, the approximation error resulting from the operating frequency and sampling rate of the digital front end may be significantly less than the approximation error arising from the momentum of the phase-locked loop 106. Moreover, the approximation error may be reduced by increasing the operating frequency and sampling rate of the digital signal modulator 212 and RF-DAC 218 without imposing additional fractional spurs that diminish the signal-to-noise ratio of the radar signal 126. Moreover, the modulation techniques do not impose an undesirable tradeoff between modulation precision and the reduction of noise due to fractional spurs.

A third technical effect that may be exhibited by a radar signal 126 modulated in accordance with the techniques presented herein is the architectural flexibility of the frequency modulator device. As a first such example, as compared with the frequency modulation technique illustrated in the example scenario 100 of FIG. 1, the use of a relatively precise local oscillator 102 may provide a reference frequency 104 to a narrow-bandwidth phase-locked loop 106, thus reducing the impact of phase noise on the radar signal 126. Alternatively, a low-noise oscillator may be processed by a high-bandwidth phase-locked loop 106, which may result in a wide-band radar signal 126 with low phase noise. As a second such example, the modulation of the signal using the provision of digital values to an RF-DAC may promote the programmability of the signal modulation device; e.g., the digital modulator may feature a variety of modulation techniques, and may allow the adjustment of the parameters of the modulation technique (e.g., the range or rate of a frequency ramp), the selection of a particular modulation technique, and/or the specification of a new modulation technique, and may apply the selected modulation in a near-instantaneous manner to the modulated signal generated and transmitted thereby. These and other technical effects may be achieved in various embodiments of the techniques presented herein.

D. PRIMARY EMBODIMENTS

Figure 3:
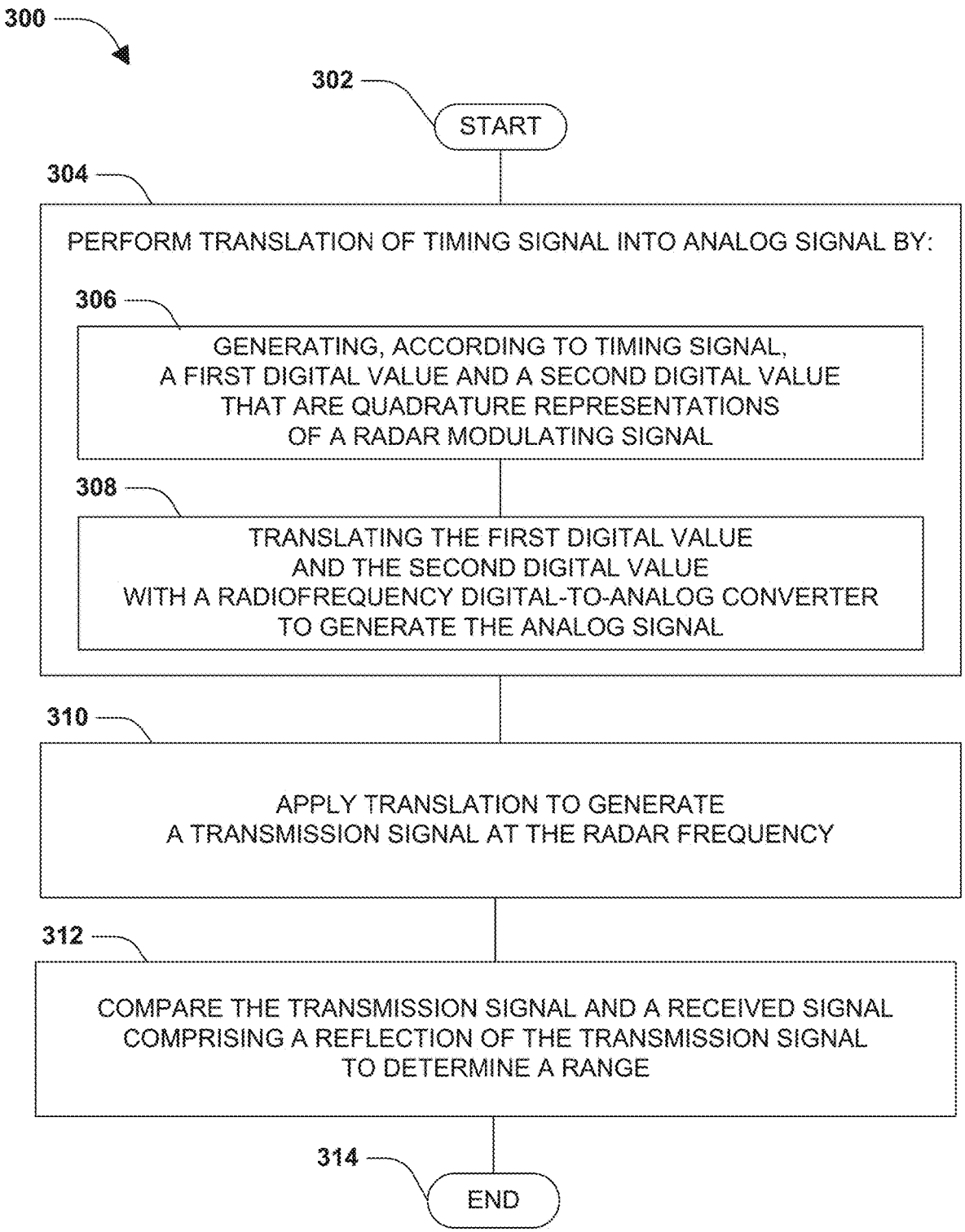
FIG. 3 is an illustration of an example method of detecting a range at a radar frequency in accordance with the techniques presented herein.

FIG. 3 is an illustration of a first example embodiment of the techniques presented herein, illustrated as an example method 300 of generating a modulated radar signal. Respective portions of the example method 300 may involve a device, and may be implemented, e.g., as a set of discrete or integrated electrical and/or electronic components; as a programmable logic circuit, such as a field-programmable gate array (FPGA); and/or as instructions stored in a memory of the device, such as firmware, system memory, a hard disk drive, a solid-state storage component, or a magnetic or optical medium, wherein the execution of the instructions by a processor of the device causes the device to operate in accordance with the techniques presented herein.

The example method 300 begins at 302 and involves performing 304 a translation of a timing signal 204 into an analog signal 220 by generating 306, according to the timing signal 204, a first digital value 214 and a second digital value 216 that are quadrature representations of a radar modulating signal, and translating 308 the first digital value 214 and the second digital value 216 with a radiofrequency digital-to-analog converter 218 to generate the analog signal 220. The example method 300 also involves applying 310 the translation to generate a radar signal 126 at the radar frequency. The example method 300 also involves comparing 312 the radar signal 126 and a received signal 130 comprising a reflection of the radar signal 126 to determine a range 140. According to one example, comparing the radar signal 126 and received signal 130 is implemented by mixing or demodulating the transmitted radar signal 126 (or a replica of the transmitted signal having the same signal course) with the received signal 130 using a mixer or an IQ demodulator. In this manner, the example method 300 enables the determination of a range 140 using a modulated radar signal generated in accordance with the techniques presented herein, and so ends at 314.

Figure 4:
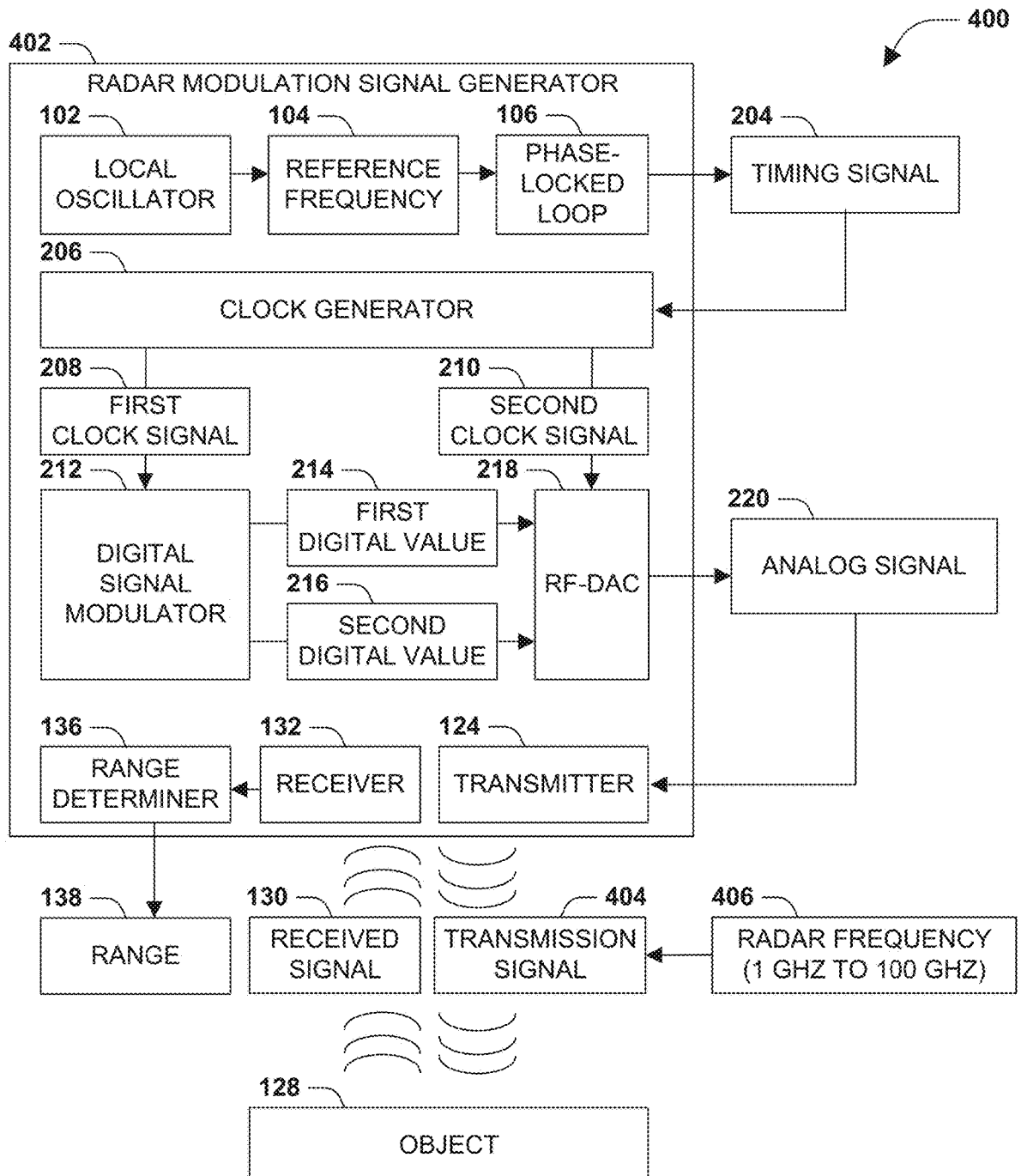
FIG. 4 is a component block diagram illustrating an example radar modulation signal generator in accordance with the techniques presented herein.

FIG. 4 is an illustration of an example scenario 400 featuring a second example embodiment of the techniques presented herein, wherein the second example embodiment comprises an example radar modulation signal generator 402. The example radar modulation signal generator 402 comprises a local oscillator 102 that generates a signal at a reference frequency 104 and a phase-locked loop 106 that provides a timing signal 204 based on the reference frequency 104. The example radar modulation signal generator 402 further comprises a clock generator 206 that translates the timing signal 204 into a first clock signal 208 and a second clock signal 210. The example radar modulation signal generator 402 further comprises a digital signal modulator 212 that, at the first clock signal 208, generates a first digital value 214 and a second digital value 216 that are quadrature representations of a modulation signal at a modulation frequency. The example radar modulation signal generator 402 further comprises a radiofrequency digital-to-analog converter 218 that, using the second clock signal 210, converts the first digital value 214 and the second digital value 216 to produce an analog signal 220. The example radar modulation signal generator 402 further comprises a transmitter 124 that generates a transmission signal 404 at a radar frequency 406 based on the analog signal 220. The example radar modulation signal generator 402 further comprises a receiver 132 that receives a received signal 130 comprising a reflection of the transmission signal 404. The example radar modulation signal generator 402 further comprises a range determiner 138 that compares the reflection of the transmission signal 404 and the transmission signal 404 to determine a range 140. In this manner, the radar modulation signal generator 402 generates a modulated transmission signal 404 at the radar frequency 406 to determine the range 140 in accordance with the techniques presented herein.

Figure 5:
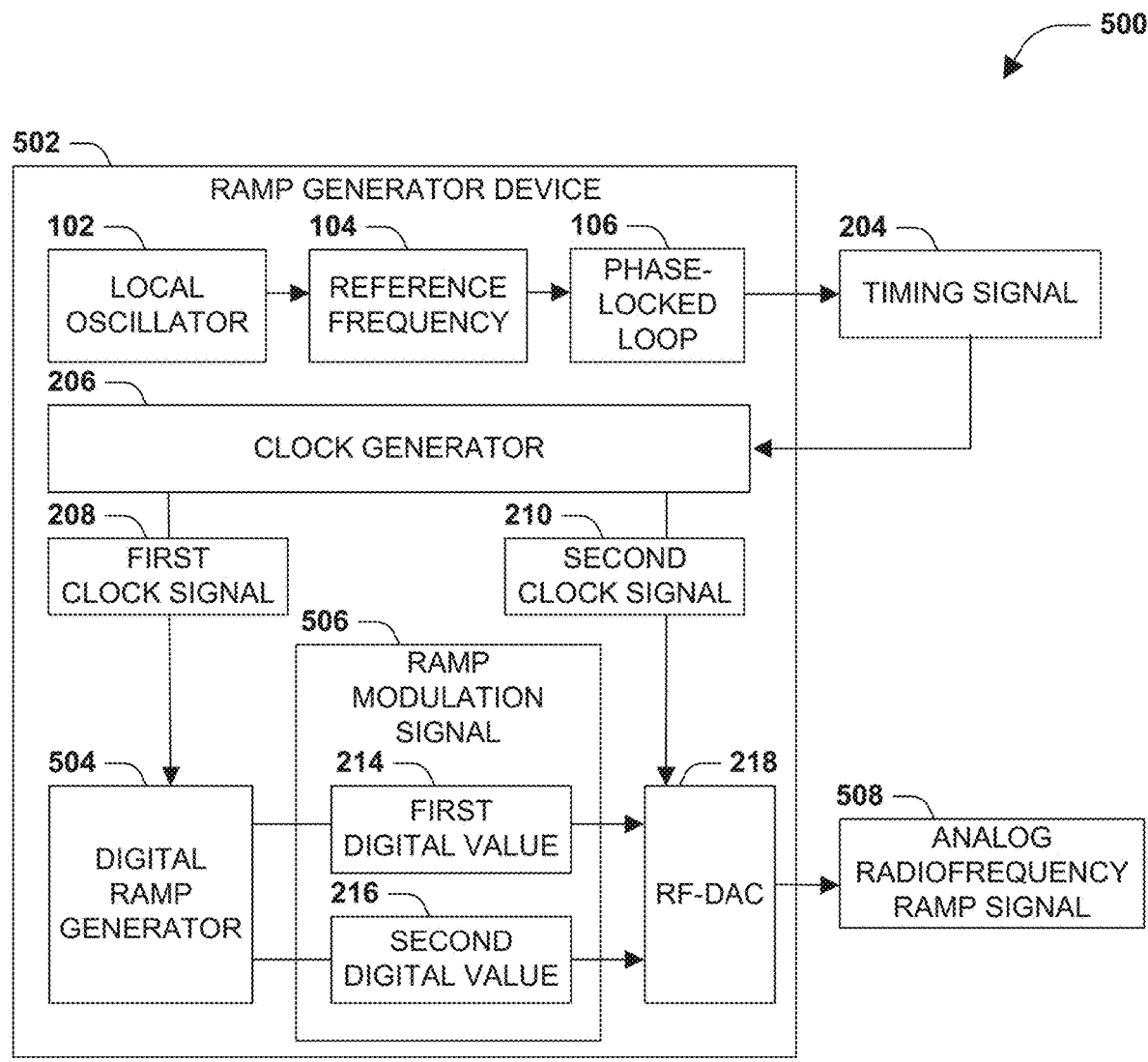
FIG. 5 is a component block diagram illustrating an example radar generator device in accordance with the techniques presented herein.

FIG. 5 is an illustration of an example scenario 500 featuring a third example embodiment of the techniques presented herein, wherein the third example embodiment comprises an example ramp generator device 502. The example ramp generator device 504 comprises a local oscillator 102 that generates a reference frequency 104. The example ramp generator device 504 further comprises a phase-locked loop 106 that provides a timing signal 204 based on the reference frequency 104. The example ramp generator device 504 further comprises a clock generator 206 that translates the timing signal 204 into a first clock signal 208 and a second clock signal 210. The example ramp generator device 504 further comprises a digital ramp generator 504 that, at the first clock signal 208, generates a first digital value 214 and a second digital value 216 that are quadrature representations of a ramp modulation signal 506. The example ramp generator device 504 further comprises a radiofrequency digital-to-analog converter 218 that, using the second clock signal 210, converts the first digital value 214 and the second digital value 216 to produce an analog radiofrequency ramp signal 508. In this manner, the ramp generator device 502 generates an analog radiofrequency ramp signal 508 in accordance with the techniques presented herein.

E. VARIATIONS

The techniques discussed herein may be devised with variations in many aspects, and some variations may present additional advantages and/or reduce disadvantages with respect to other variations of these and other techniques. Moreover, some variations may be implemented in combination, and some combinations may feature additional advantages and/or reduced disadvantages through synergistic cooperation. The variations may be incorporated in various embodiments to confer individual and/or synergistic advantages upon such embodiments.

E1. Scenarios

A first aspect that may vary among scenarios in which the techniques may be utilized relates to the devices with which such techniques may be utilized.

As a first variation of this first aspect, embodiments of the techniques may produce a variety of modulated signals. As a first such example, the modulated signals be generated at a variety of frequencies, such as a radar frequency range (e.g., 1 gigahertz to 100 gigahertz), or at other frequency ranges of the electromagnetic spectrum. As a second such example, the signals may exhibit a variety of periodic functions, such as sinusoids, square waves, and triangular waves, and/or combinations thereof. As a third such example, the modulated signals may be modulated in a variety of ways, such as frequency modulation, amplitude modulation, and phase modulation, and/or combinations thereof. As a fourth such example, the modulated signals may be used in a variety of applications, such as distance and/or location estimation; direction estimation; velocity estimation; and analog or digital communication.

As a second variation of this first aspect, the embodiments of the techniques presented herein may utilize a variety of technologies to implement one or more components. As a first such example, an element of a device utilizing at least a portion of the techniques presented herein may comprise electrical or electronic active or passive components, such as a combination of resistors, capacitors, inductors, transformers, and transistors. Such components may be organized as a combination of discrete components; an integrated circuit, such as an application-specific integrated circuit (ASIC); or a combination thereof. As a second such example, an element of a device utilizing at least a portion of the techniques presented herein may feature a programmable circuit, such as a field-programmable gate array (FPGA). As a third such example, an element of a device utilizing at least a portion of the techniques presented herein may feature a microprocessor that executes instructions stored in a memory (e.g., a volatile or nonvolatile memory circuit; a platter of a hard disk drive; a solid-state storage device; a flash memory device such as a ROM, an EPROM, or an EEPROM; or an optical or magnetic storage device such as a CD-ROM, DVD-ROM, or BD-ROM), wherein execution of the instructions by the processor causes the device to implement at least a portion of the techniques presented herein.

As a third variation of this first aspect, embodiments of the presented devices may exhibit a variety of system architectures. As a first such example, an embodiment of the techniques presented herein may comprise a single device that implements an application, such as a ranging device that utilizes a modulated radar signal to determine the range, optionally including a user interface that reports the range to a user. As a second such example, an embodiment of the techniques presented herein may comprise a component of another device, such as an embodiment comprising a ranging device that is deployed in a vehicle, and that determines a range between the vehicle and another vehicle, e.g., in an application such as autonomous vehicle navigation or user-assisted vehicle navigation. As a third such example, an embodiment of the techniques presented herein may be implemented over a set of interoperating devices, which may communicate over wired connection (e.g., a bus, a cable, a set of connective traces integrated in a surface, a network connection such as Ethernet) and/or wireless connections (e.g., an infrared, Bluetooth, or WiFi connection), wherein respective devices implement a portion of the techniques presented herein, and the set of interoperating devices implement an embodiment of the techniques presented herein. Many scenarios may be devised in which an embodiment of the presented techniques may be utilized.

E2. Transmission Signal Modulation

A second aspect that may vary among embodiments of the techniques presented herein involves the modulation of the transmission signal.

As a first variation of this second aspect, embodiments of the techniques presented herein may incorporate a variety of phase-locked loops to generate the timing signal 204. In some such embodiments, the phase-locked loop 106 may comprise an integer feedback frequency divider 202 that switches the reference frequency 104 (e.g., the output of the loop filter 112) at a programmable switching schedule according to an integer frequency multiplier. The integer feedback frequency divider 202 may receive the output of the loop filter 112 and generate a switch signal that causes the phase frequency detector 108 to alter the reference frequency 104, e.g., by inverting the reference frequency 104 at selected portions of the period of the reference frequency 104, thereby upconverting the reference frequency 104 to produce a timing signal 204 corresponding to an operational or base frequency of the modulation components. In some embodiments, the integer feedback frequency divider 202 provides a fixed frequency division, e.g., a fixed switching schedule that is maintained throughout transmission of the analog signal 220. Alternatively, the switching schedule of the integer feedback frequency divider 202 may be changed, e.g., to transition between a first timing signal 204 at a first operational frequency and a second timing signal 204 at a second operational frequency. While variable switching may introduce noise, such noise may be ephemeral and/or occasional, and may therefore be inconsequential to the signal-to-noise ratio of the transmission signal as compared with the fractional spurs caused by the highly variable switching schedule of a multi-modulus feedback frequency divider 114 such as depicted in the example scenario 100 of FIG. 1.

As a second variation of this second aspect, the digital signal modulator 212 may generate modulation signals using a variety of components. As an example, a digital ramp may be generated by a combination of a first integrator that generates an increasing digital value and a numerically controlled oscillator that generates quadrature representations of the ramp modulation signal at frequencies that are proportional to the increasing digital value. The numerically controlled oscillator may comprise, e.g., a second integrator that integrates the increasing digital value produced by the first integrator to produce a cyclic digital value, e.g., digital values corresponding to degrees over the range of 0 to 360 degrees, or radians over the range of 0 to $2\pi$. In one such embodiment, the second integrator further comprises a modulus integrator that produces the cyclic digital value as a modular integral of the increasing digital value. For example, the second integrator may comprise an eight-bit register that iteratively adds the increasing value of the first integrator, wherein the value of the eight-bit register represents degrees over the range of 0 (represented as 0x00) to 359 degrees (represented as 0xFF). Addition of incremental values that exceed the highest value of the eight-bit register cause an overflow that applies a modulus of 360 to the added values (e.g., adding 0x04 to a register value of 0xFC, corresponding to 357 degrees or 6.23 radians, produces a new register value of 0x02, corresponding to 3 degrees or 0.05 radians). In this manner, the cyclic digital value is produced as a modular integral of the increasing value produced by the first integrator.

As a third variation of this second aspect, a digital signal modulator 212 and the RF-DAC 218 may exhibit a variety of modulation signals. As a first such example, the incrementing of the increasing digital value produced by the first integrator, which the second integrator adds to the cyclic digital value, may cause the frequency of the generated signal to rise steadily over a frequency ramp. In some embodiments, the first integrator may increase the increasing digital value at a selected rate, producing a linear frequency ramp. Alternatively, the first integrator may increase the increasing digital value at a variable rate, producing a nonlinear frequency ramp such as an exponential or sinusoidal frequency ramp; may produce a decreasing digital value, such as a negative frequency ramp; may cycle between an increasing frequency ramp and a decreasing frequency ramp; etc. In some embodiments, the increasing digital value may occasionally reset, causing the frequency ramp modulation to exhibit a cyclic or sawtooth ramp. In some embodiments, the numerically controlled oscillator may comprise a coordinate rotation digital generator (e.g., a circuit implementing a CORDIC technique) that receives a cyclic digital value and generates the first digital value 214 as a sine of the cyclic digital value, and the second digital value 216 as a cosine of the cyclic digital value. In some embodiments, the RF-DAC 218 may utilize the first digital value 214 and the second digital value 216 to alter the frequency of the transmission signal, e.g., as a frequency ramp. Alternatively, the RF-DAC may utilize the first digital value 214 and the second digital value 216 to modulate other properties of the transmission signal, such as amplitude and/or phase. In some embodiments, the digital values generated by the digital signal modulator 212 and utilized by the RF-DAC 218 may comprise integers exhibiting a bit resolution, such as 6-bit, 7-bit, 8-bit, or 9-bit integers, or any other numerical format and bit resolution.

As a fourth variation of this second aspect, the components of the digital signal modulator 212 may operate at a variety of operating frequencies. As a first such example, the clock generator 206 may produce the first clock signal 208 at a first clock frequency selected within a frequency range of 1 gigahertz to 10 gigahertz, e.g., to match the frequencies at the top and bottom of a frequency ramp. As a second such example, the clock generator 206 may produces the second clock signal 210 at a second clock frequency selected within a frequency range of 6 gigahertz to 10 gigahertz. A frequency ramp resulting from the selection of the first clock signal 208 exhibiting a second clock frequency $f_d$ (utilized by the digital signal modulator 212) and the second clock signal 210 exhibiting a second clock frequency $f_s$ (utilized by the RF-DAC 218) may result in a frequency ramp over the frequency range:

$$f_s - \frac{f_d}{2} < f < f_s + \frac{f_d}{2}$$

As an example, if $f_s$ is selected as 8 gigahertz and $f_d$ is selected as 4 gigahertz, the resulting modulated signal exhibits a frequency ramp between 6 gigahertz and 10 gigahertz. In an embodiment, the second clock frequency is selected at least 60% as the first clock frequency, which may reduce the formation of fractional spurs. As a third such example, the numerically controlled oscillator may operate at the first clock signal 208 and according to a first clock frequency, and the first integrator may operate at a third clock signal that is a lower frequency than the first clock frequency of the first clock signal 208. As a fourth such example, the phase-locked loop 202 may operate at a comparatively low frequency, thereby reducing pulling effects that may be caused by operation of the phase-locked loop 202 at a high frequency. Many such variations may be included in the generation of the modulated signal in accordance with the techniques presented herein.

E3. Signal Upconversion and Transmission

A third aspect that may vary among embodiments of the techniques presented herein involves the upconversion and transmission of the analog signal 220 produced by the RF-DAC 218 to provide a transmission signal 404 at a radar frequency 406.

As a first variation of this third aspect, the clock generator 206 may further translate the timing signal 204 into a transmission upconversion clock signal, which may be combined (e.g., mixed) with the analog signal 220 to upconvert the analog signal 220 from frequencies in the operating ranges of the digital signal modulator 212 and/or the RF-DAC 218 to the radar frequency 406 within the radar frequency range. In some such embodiments, the mixing of the analog signal with the transmission upconversion frequency generates the transmission signal at a transmission frequency that is a non-integer fractional multiple of a timing signal frequency of the timing signal 204 produced by phase-locked loop 106, thereby reducing the correspondence of the frequency of the local oscillator 102 with the frequency of the transmission signal 404 and noise-inducing "pulling" effects that may result therefrom. As a further example, the clock generator 296 may further translate the timing signal 204 into an intermediate upconversion clock signal, and the transmitter 124 may further generate the transmission signal 404 by mixing the analog signal 220 with an intermediate upconversion frequency, $f_1$, according to the upconversion clock signal to generate an intermediate signal at an intermediate frequency, and then mixing the intermediate signal with the transmission upconversion frequency according to the transmission upconversion clock signal. The intermediate mixing may result in a lower-frequency image at $$f_1 - f_s + \frac{f_d}{2}$$

and a higher-frequency image at $$f_1 + f_s - \frac{f_d}{2}.$$

The higher-frequency upconverted image is desired and the lower-frequency downconverted image is desirably attenuated; accordingly, in some embodiments, an image rejection filter may be included that filters the intermediate signal to reject the low-frequency image. In an embodiment, the image rejection filter comprises a second-order bandpass filter, such as a resonant LC tank circuit. As an example, the transmission upconversion frequency (may be selected from a frequency range of 20 gigahertz to 60 gigahertz, and the intermediate upconversion frequency is selected from a frequency range of 10 gigahertz to 20 gigahertz. As an example, mixing an analog signal ramp between 6 and 10 gigahertz with an intermediate upconversion frequency at 10 gigahertz and a transmission upconversion frequency of 60 gigahertz results in a transmission signal 404 exhibiting a frequency ramp between 76 gigahertz and 80 gigahertz.

Figure 6:
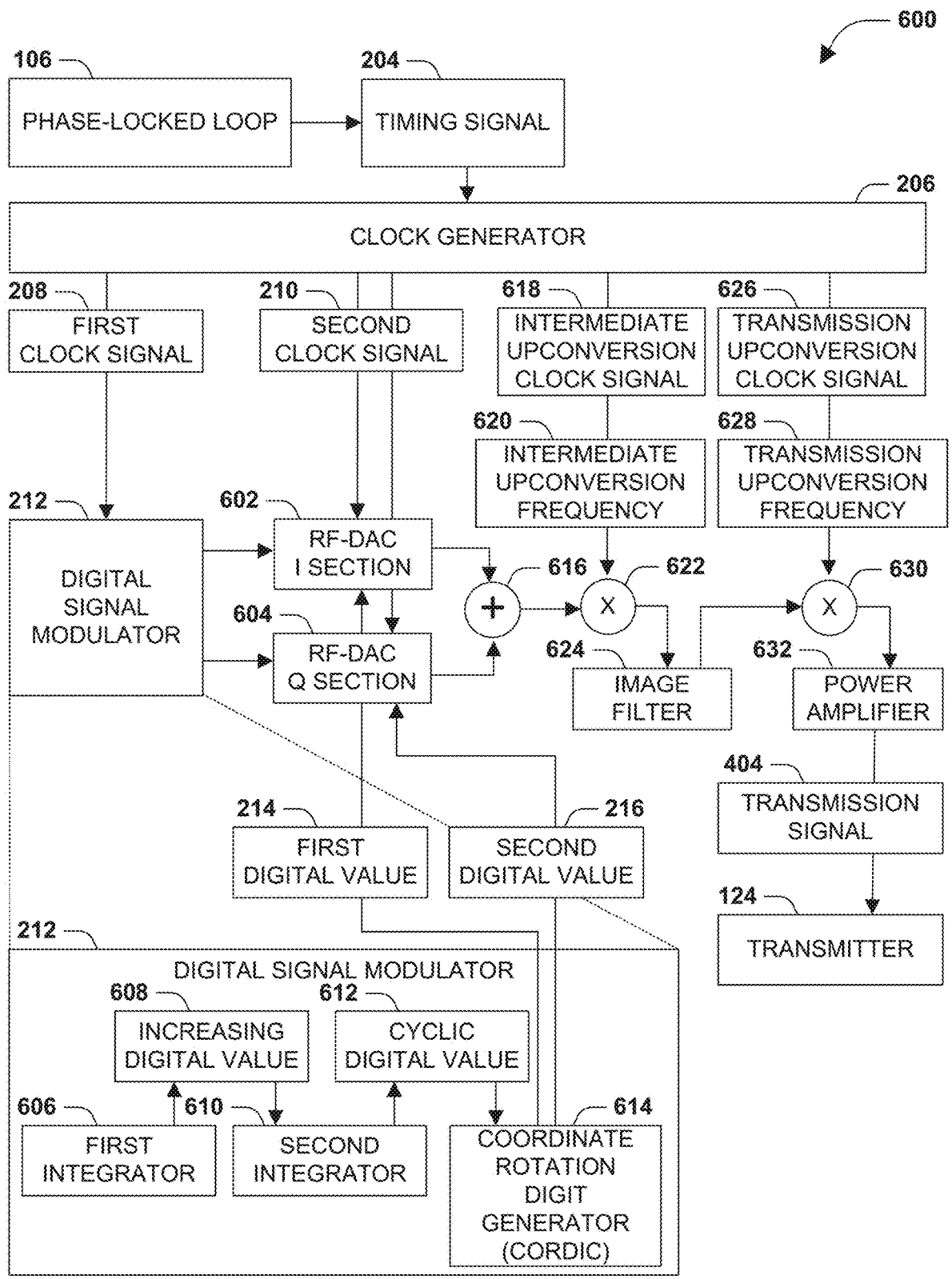
FIG. 6 is a component block diagram illustrating an example scenario featuring a generation of a modulated digital signal in accordance with the techniques presented herein.

FIG. 6 is an illustration of an example modulated radar signal generation and transmission in accordance with the techniques presented herein. In this example scenario 600, a phase-locked loop 106 generates a timing signal 204 (e.g., translated from a reference frequency 104 provided by a local oscillator 102) for a clock generator 206, which generates four clock signals: the first clock signal 208 used by the digital signal modulator; the second clock signal 210 used by the RF-DAC 218, which comprises an I-section 602 and a Q-section 604; an intermediate upconversion clock signal 618 at an intermediate upconversion frequency 620; and a transmission upconversion clock signal 626 at a transmission upconversion frequency 628. The digital signal modulator 212 comprises a first integrator 606 that produces an increasing digital value 608 and a second integrator 610 that integrates the increasing digital value 608 to produce a cyclic digital value 612. The cyclic digital value 612 is provided to a coordinate rotation digital generator 614 (e.g., a CORDIC generator) that produces the first digital value 214 (e.g., a sine value) and the second digital value 216 (e.g., a cosine value), which are provided, respectively, to the I section 602 and the Q section 604 of the RF-DAC. The output of the I section 602 and the Q section 604 is added 616 (e.g., by a voltage adder) to produce a quadrature signal, which is mixed 622 with the intermediate upconversion frequency 620 to provide an intermediate upconverted signal. The intermediate upconverted signal is passed through an image filter 624 to attenuate the lower-frequency image, and the output of the image filter 624 is subjected to a second mixing 640 with the transmission upconversion frequency 628 to produce the transmission signal 404 at a radar frequency 406. The transmission signal 404 may then be amplified by a power amplifier 632 and delivered to a transmitter 124, such as an antenna, for transmission. In this manner, a transmission signal 404 in the radar frequency range exhibiting a modulation, in the form of a frequency ramp, may be generated and transmitted in accordance with the techniques presented herein.

F. SUPPORTING DATA

Figure 7A:
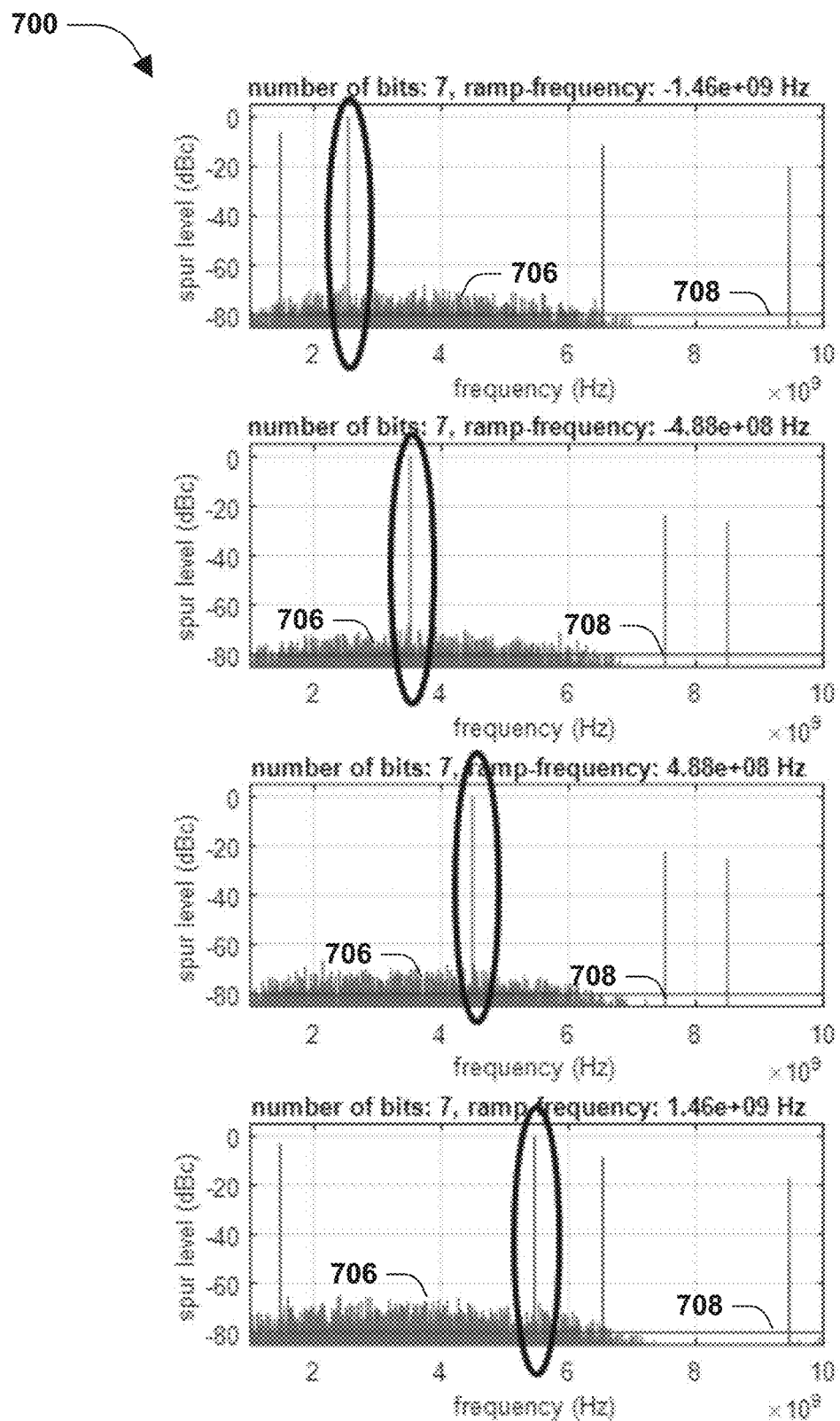
FIGS. 7A-7C are data sets illustrating the generation of a modulated digital signal using a radiofrequency digital-to-analog encoder with digital values representing quadrature representations of a modulated radar signal with a variable bit resolution in accordance with the techniques presented herein.
Figure 7B:
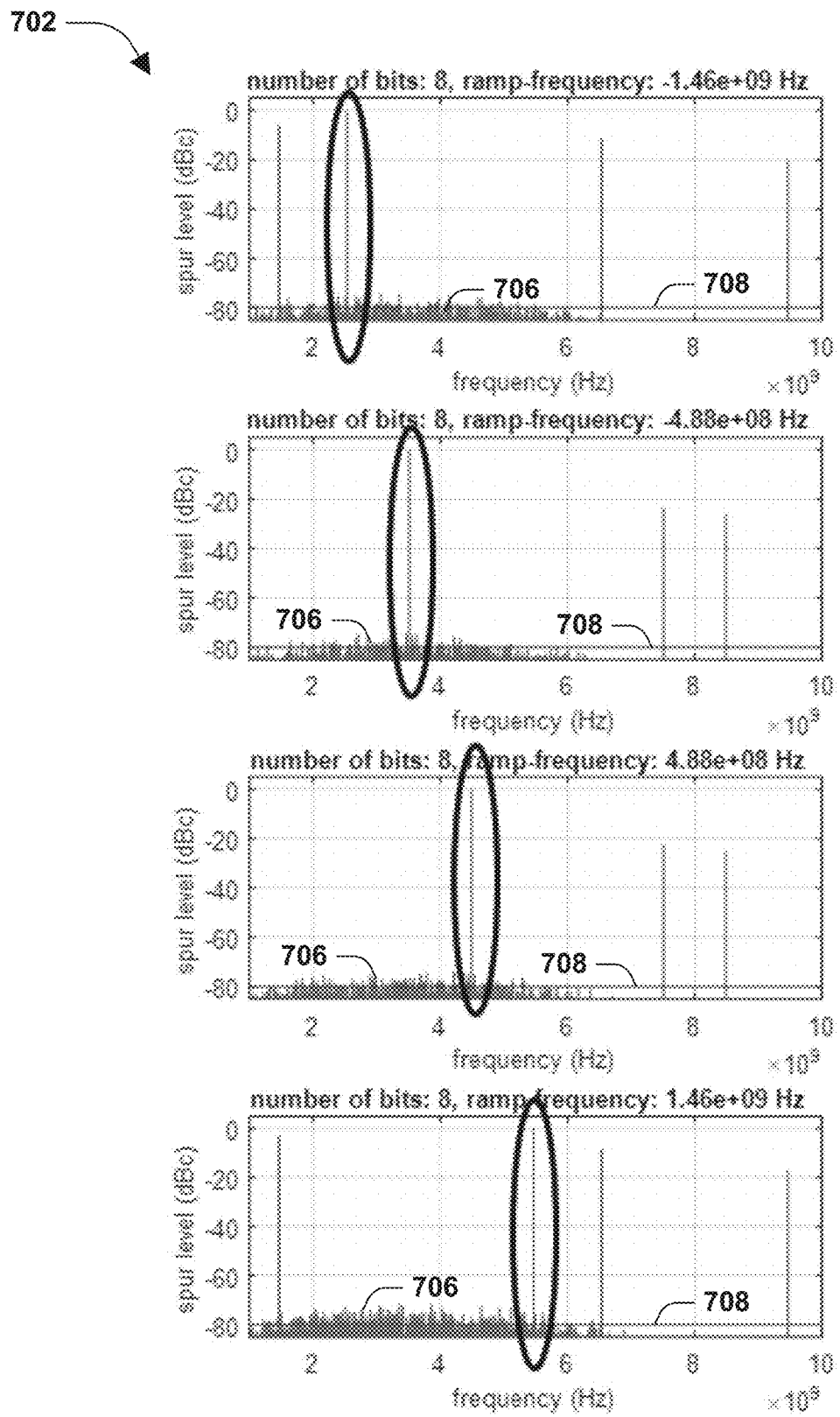
Figure 7C:
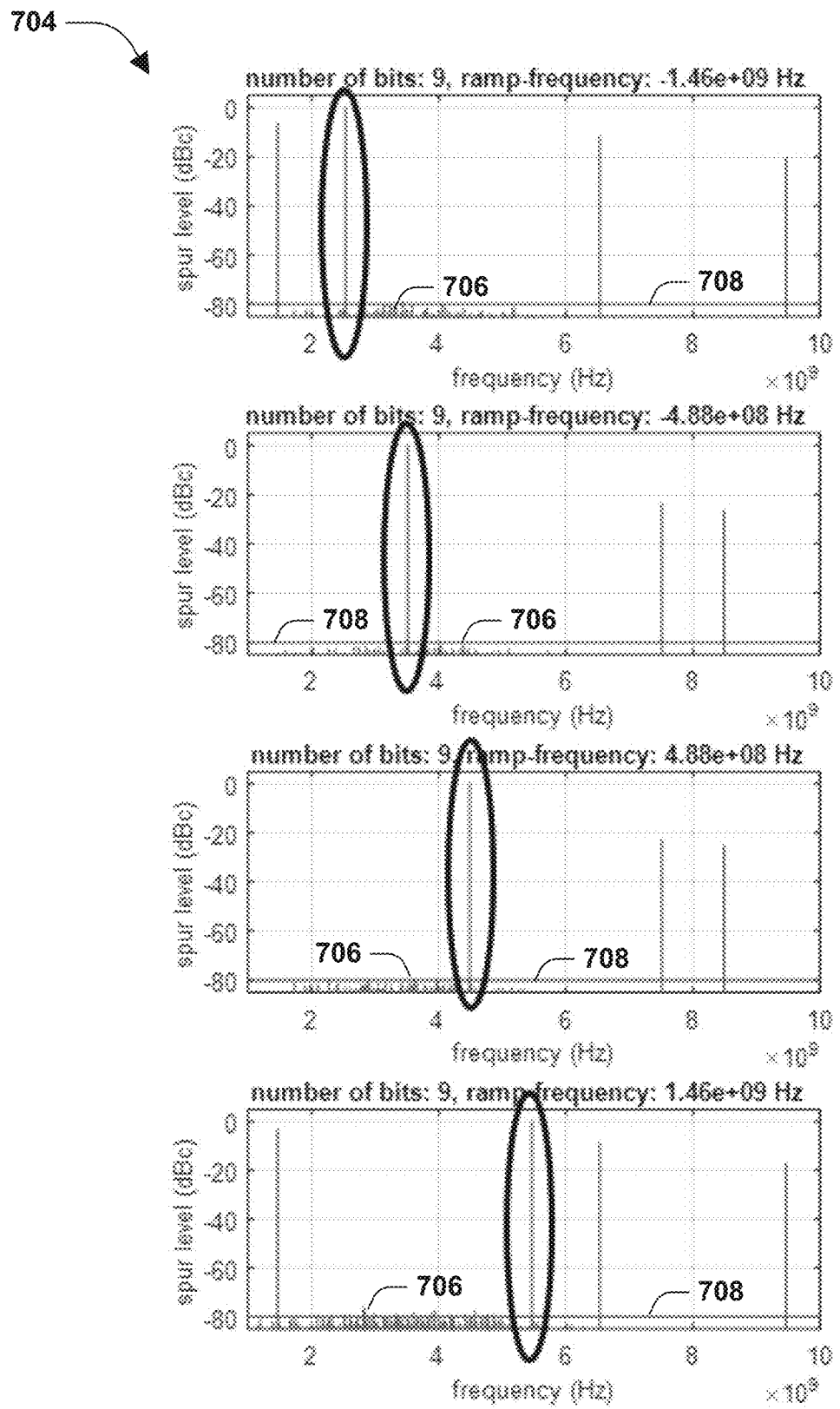

FIGS. 7A-7C provide data sets that demonstrate the selection of the signal-to-noise ratio of the transmission signal 404 at various frequencies as a function of the bit resolution of the digital signal modulator 212 and the RF-DAC 218. In the example data set 700 of FIG. 7A, generating values by a CORDIC generator for an RF-DAC with a 7-bit resolution to produce transmission signals 404 in the radar frequency range results in a significant background noise level 706 at all selected frequencies. In the example data set 702 of FIG. 7B, generating values by a CORDIC generator for an RF-DAC with an 8-bit resolution results in reduced background noise level 706 at all selected frequencies; and in the example data set 704 of FIG. 7C, generating values by a CORDIC generator for an RF-DAC with a 9-bit resolution results in still further reduced background noise level 706 at all selected frequencies. The target signal-to-noise ratio of an application achievable by the various bit resolutions may therefore inform toward component selection of a bit resolution for the digital signal modulator 212 and the RF-DAC 218 that provides an adequate signal-to-noise ratio for a selected application (such as an average noise below a noise floor 708) while reducing component costs and power consumption.

G. FURTHER PRIMARY EMBODIMENTS

Figure 8:
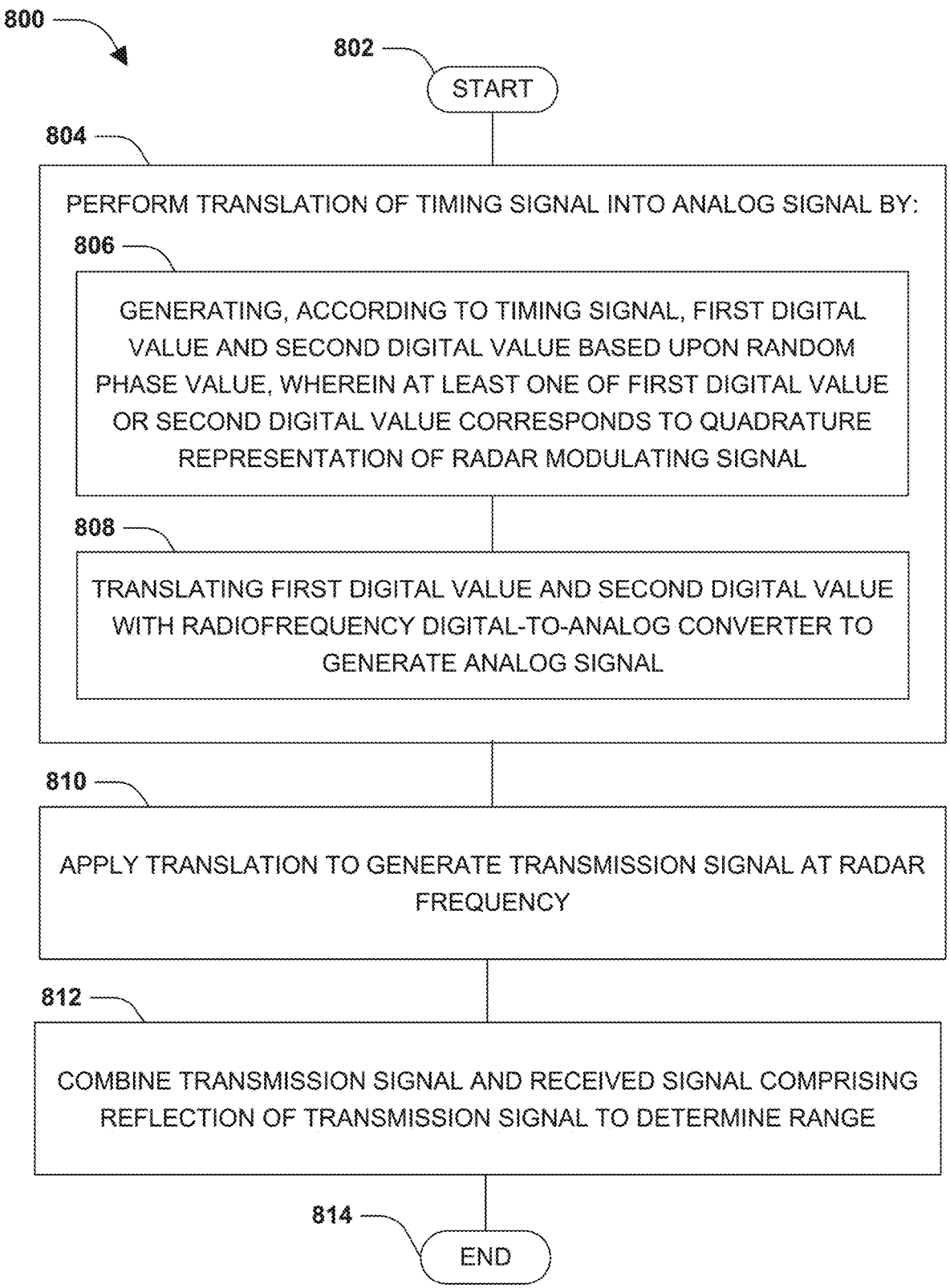
FIG. 8 is an illustration of an example method of detecting a range at a radar frequency in accordance with the techniques presented herein.

FIG. 8 is an illustration of a fourth example embodiment of the techniques presented herein, illustrated as an example method 800 of generating a modulated radar signal and/or detecting a range at a radar frequency. Respective portions of the example method 800 may involve a device, and may be implemented, e.g., as a set of discrete or integrated electrical and/or electronic components; as a programmable logic circuit, such as a field-programmable gate array (FPGA); and/or as instructions stored in a memory of the device, such as firmware, system memory, a hard disk drive, a solid-state storage component, or a magnetic or optical medium, wherein the execution of the instructions by a processor of the device causes the device to operate in accordance with the techniques presented herein.

The example method 800 begins at 802 and involves performing 804 a translation of a timing signal 204 into an analog signal 220 by generating 806, according to the timing signal 204, a first digital value 214 and a second digital value 216 based upon a random phase value (e.g., a true random phase value or a pseudo-random phase value), and translating 808 the first digital value 214 and the second digital value 216 with a radiofrequency digital-to-analog converter 218 to generate the analog signal 220, wherein the first digital value 214 and/or the second digital value 216 correspond to a quadrature representation of a radar modulating signal. The example method 800 also involves applying 810 the translation to generate a transmission signal (e.g., a radar signal 126 and/or a transmission signal 404) at the radar frequency. The example method 800 also involves combining 812 the radar signal 126 and a received signal 130 comprising a reflection of the radar signal 126 to determine a range 140. For example, the radar signal 126 and the received signal 130 may be compared to determine the range 140. According to one example, combining (e.g., comparing) the radar signal 126 and received signal 130 is implemented by mixing or demodulating the transmitted radar signal 126 (or a replica of the transmitted signal having the same signal course) with the received signal 130 using a mixer or an IQ demodulator. In this manner, the example method 800 enables the determination of a range 140 using a modulated radar signal generated in accordance with the techniques presented herein, and so ends at 814.

In some examples, the random phase value may be generated using a random value generator (e.g., a true random value generator or a pseudo-random value generator). In an example, the random value generator may store a plurality of phase values comprising the random phase value (e.g., the plurality of random phase values may be stored in a look-up table). The random phase value may be sampled from the plurality of random phase values.

In some examples, the random phase value is combined with (e.g., summed with) a first cyclic digital value to generate a third digital value (e.g., the third digital value may be a sum of the first cyclic digital value and the random phase value). The first digital value 214 is based upon the third digital value. For example, the first digital value 214 may be generated as a sine of the third digital value.

In some examples, the random phase value is combined with (e.g., summed with) a second cyclic digital value to generate a fourth digital value (e.g., the fourth digital value may be a sum of the second cyclic digital value and the random phase value). The second digital value 216 is based upon the fourth digital value. For example, the second digital value 216 may be generated as a cosine of the fourth digital value.

In some examples, an increasing digital value is generated. The increasing digital value may be integrated using a first integrator to generate the first cyclic digital value. The increasing digital value may be integrated using a second integrator to generate the second cyclic digital value.

In some examples, the radar modulating signal comprises a frequency ramp.

In some examples, the random phase value may be a random initial phase value associated with a start of the frequency ramp. For example, the random phase value may be combined with the first cyclic digital value (to generate the third digital value, for example) and the random phase value may be combined with the second cyclic digital value (to generate the fourth digital value, for example) at a start of the frequency ramp. In some examples, for each frequency ramp of the radar modulating signal, a random phase value of the plurality of phase values may be combined with the first cyclic digital value and the second cyclic digital value merely once (at a start of the frequency ramp, for example). In some examples, a random phase value of the plurality of phase values may be combined with the first cyclic digital value and the second cyclic digital value at a start of each frequency ramp of the radar modulating signal.

Figure 9A:
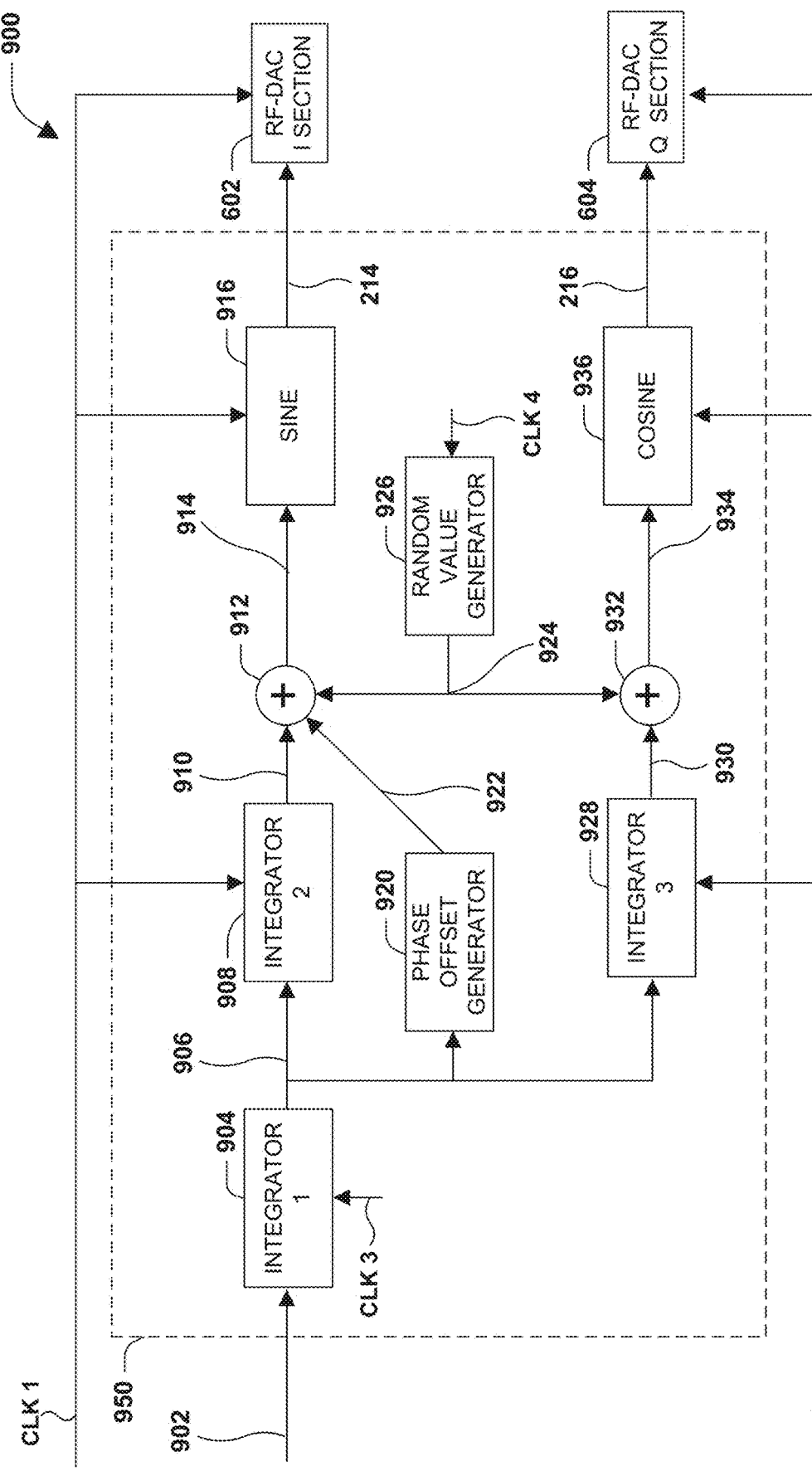
FIG. 9A-9B are component block diagrams illustrating an example digital signal modulator in accordance with the techniques presented herein.

FIG. 9A is an illustration of an example scenario 900 featuring a fifth example embodiment of the techniques presented herein, wherein the fifth example embodiment comprises an example digital signal modulator 950 of a radar modulation signal generator (e.g., the example radar modulation signal generator 402) and/or a ramp generator device (e.g., the example ramp generator device 502). In an example, the example digital signal modulator 950 may correspond to (and/or may be used as) the example digital signal modulator 212 and/or the example ramp generator device 504. In an example, the example digital signal modulator 950 may comprise a direct digital frequency synthesizer (DDFS), such as a numerically controlled oscillator (NCO)-based DDFS.

The example digital signal modulator 950 may be provided with one or more clock signals comprising a first clock signal CLK 1, a second clock signal CLK 2, a third clock signal CLK 3 and/or a fourth clock signal CLK 4. For example, the one or more clock signals may be generated by a clock generator 206 (e.g., the clock generator 206 translates a timing signal 204 into the one or more clock signals). In some examples, a phase of the first clock signal CLK 1 and a phase of the second clock signal CLK 2 are in quadrature.

The example digital signal modulator 950 may generate a first digital value 214 and a second digital value 216, wherein the first digital value 214 and/or the second digital value 216 correspond to a quadrature representation of a modulation signal at a modulation frequency. In some examples, the example digital signal modulator 950 may generate the first digital value 214 and the second digital value 216 using one or more first clock signals. The one or more first clock signals may comprise the first clock signal CLK 1 and the second clock signal CLK 2. In an example, the example digital signal modulator 950 may generate the first digital value 214 at the first clock signal CLK 1 and/or may generate the second digital value 216 at the second clock signal CLK 2.

In some examples, the example digital signal modulator 950 comprises a first integrator 904 (INTEGRATOR 1) (e.g., a frequency accumulator comprising a flip-flop and/or a combination module such as a summer) that generates an increasing digital value 906. For example, the first integrator 904 may integrate delta frequency control word (ΔFCW) 902 to generate the increasing digital value 906 (e.g., the increasing digital value 906 may be frequency control word (FCW), such as a sawtooth shaped FCW). In some examples, the first integrator 904 operates at the third clock signal CLK 3 to generate the increasing digital value 906.

In some examples, the example digital signal modulator 950 comprises a second integrator 908 (e.g., a phase accumulator comprising a flip-flop and/or a combination module such as a summer) that integrates the increasing digital value 906 to generate a first cyclic digital value 910. In some examples, the second integrator 908 operates at the first clock signal CLK 1 to generate the first cyclic digital value 910 (e.g., the first cyclic digital value 910 may be a phase value).

In some examples, the example digital signal modulator 950 comprises a third integrator 928 (e.g., a phase accumulator comprising a flip-flop and/or a combination module such as a summer) that integrates the increasing digital value 906 to generate a second cyclic digital value 930. In some examples, the third integrator 928 operates at the second clock signal CLK 2 to generate the second cyclic digital value 930 (e.g., the second cyclic digital value 930 may be a phase value).

In some examples, the example digital signal modulator 950 comprises a random value generator 926 (e.g., a true random value generator or a pseudo-random value generator) that generates a random phase value 924 (e.g., a random initial phase value). In an example, the random value generator 926 may store a plurality of phase values comprising the random phase value 924 (e.g., the plurality of random phase values may be stored in a look-up table). The random phase value 924 may be sampled from the plurality of random phase values. In an example, the plurality of random phase values may comprise S phase values (over the range of 0 to 360 degrees, or radians over the range of 0 to $2\pi$, for example) and/or the plurality of phase values may be normalized by 360/2T degrees, or $2\pi/2T$ radians. In some examples, S and/or T may be equal to a quantity of bits, N (e.g., N may correspond to the quantity of bits of the first bits and/or the quantity of bits of the third bits discussed below). Alternatively and/or additionally, S and/or T may be different than N. In some examples, S may be equal to T. Alternatively and/or additionally, S may be different than T. In an example, S may be 10, 20 or other quantity of phase values, and T may be equal to the quantity of bits, N. In some examples, the random value generator 926 operates at the fourth clock signal CLK 4 to generate the random phase value 924. In some examples, the random phase value 924 is generated by the random value generator 926 (and/or is sampled from the plurality of random phase values) at a start of a frequency ramp of a transmission signal (e.g., an analog radio frequency signal, a radar signal 126 and/or a transmission signal 404) and/or a radar modulating signal. For example, the random phase value 924 may be generated by the random value generator 926 (and/or may be sampled from the plurality of random phase values) according to the fourth clock signal CLK 4, wherein a period of the fourth clock signal CLK 4 may correspond to a period of the frequency ramp.

In some examples, the example digital signal modulator 950 comprises a first combination module 912 (e.g., a summer) that combines (e.g., sums) the random phase value 924 with the first cyclic digital value 910 to generate a third digital value 914. In some examples, the first combination module 912 combines the random phase value 924 with the first cyclic digital value 910 to generate the third digital value 914 at a start of the frequency ramp. Alternatively and/or additionally, the first combination module 912 may combine the random phase value 924, the first cyclic digital value 910 and a phase offset value 922 to generate the third digital value 914. The phase offset value 922 may be generated by a phase offset generator 920. It may be appreciated that combining the random phase offset value 922 to generate the third digital value 914 may mitigate and/or cancel (e.g., filter) an image associated with the second integrator 902 and the third integrator 928 operating at the first clock signal CLK 1 and the second clock signal CLK 2, respectively. In an example, the random phase offset value 922 may correspond to 90 degrees, or $\pi/2$ radians. In an example, the third digital value 914 may be equal to (and/or based upon) a sum of the random phase value 924 and the first cyclic digital value 910 subtracted by the phase offset value 922.

In some examples, the example digital signal modulator 950 comprises a second combination module 932 (e.g., a summer) that combines (e.g., sums) the random phase value 924 with the second cyclic digital value 930 to generate a fourth digital value 934. In some examples, the second combination module 932 combines the random phase value 924 with the second cyclic digital value 930 to generate the fourth digital value 934 at a start of the frequency ramp. In an example, the fourth digital value 934 may be equal to (and/or based upon) a sum of the random phase value 924 and the second cyclic digital value 930.

In some examples, the example digital signal modulator 950 comprises a first digital generator 916 (e.g., a coordinate rotation digital generator) that generates the first digital value 214 as a sine of the third digital value 914. In some examples, the first digital generator 916 operates at the first clock signal CLK 1 to generate the first digital value 214. In some examples, the first digital generator 916 comprises a look-up table of sine values and/or generates the first digital value 214 based upon the look-up table. The first digital value 214 may be provided to the RF-DAC 218, such as to the I-section 602 of the RF-DAC 218.

In some examples, the example digital signal modulator 950 comprises a second digital generator 936 (e.g., a coordinate rotation digital generator) that generates the second digital value 216 as a cosine of the fourth digital value 934. In some examples, the second digital generator 936 operates at the second clock signal CLK 2 to generate the second digital value 216. In some examples, the second digital generator 936 comprises a look-up table of cosine values and/or generates the second digital value 216 based upon the look-up table. The second digital value 216 may be provided to the RF-DAC 218, such as to the Q-section 604 of the RF-DAC 218.

In some examples, the first digital value 214 may be equal to and/or based upon:

$$\sin(X+\phi_{rand})$$

where $\phi_{rand}$ is the random phase value 924 (e.g., the random initial phase value), $X=2\pi \times FCW \times n$ and/or n is in a range of 0 to $2^G$ (and/or n=0, ..., $2^G$ and/or $$n = \frac{FCW}{\Delta FCW}\Bigr).$$

In some examples, G may be equal to a quantity of bits, N (e.g., N may correspond to the quantity of bits of the first bits and/or the quantity of bits of the third bits discussed below). Alternatively and/or additionally, G may be different than N.

In some examples, the second digital value 216 may be equal to and/or based upon:

$$\cos(X+\phi_{rand})$$

where $\phi_{rand}$ is the random phase value 924 (e.g., the random initial phase value), X=2π×FCW×n and/or n is in a range of 0 to $2^G$ (and/or n=0, ..., $2^G$ and/or $$n = \frac{FCW}{\Delta FCW}\bigg).$$

In some examples, G may be equal to a quantity of bits, N (e.g., N may correspond to the quantity of bits of the first bits and/or the quantity of bits of the third bits discussed below). Alternatively and/or additionally, G may be different than N.

In some examples, the RF-DAC 218 converts, using one or more second clock signals, the first digital value 214 and the second digital value 216 to produce a transmission signal (e.g., an analog radio frequency signal, a radar signal 126 and/or a transmission signal 404) comprising a frequency ramp in accordance with the techniques presented herein. In some examples, the one or more second clock signals are different than the one or more first clock signals. The RF-DAC 218 may operate at the one or more second clock signals to convert the first digital value 214 and the second digital value 216 to produce the transmission signal. Alternatively and/or additionally, the one or more second clock signals may be the same as the one or more first clock signals. In an example, the I-section 602 of the RF-DAC 218 may operate at the first clock signal CLK 1 and the Q-section 604 of the RF-DAC 218 may operate at the second clock signal CLK 2 (to convert the first digital value 214 and the second digital value 216 to produce the transmission signal, for example).

Figure 9B:
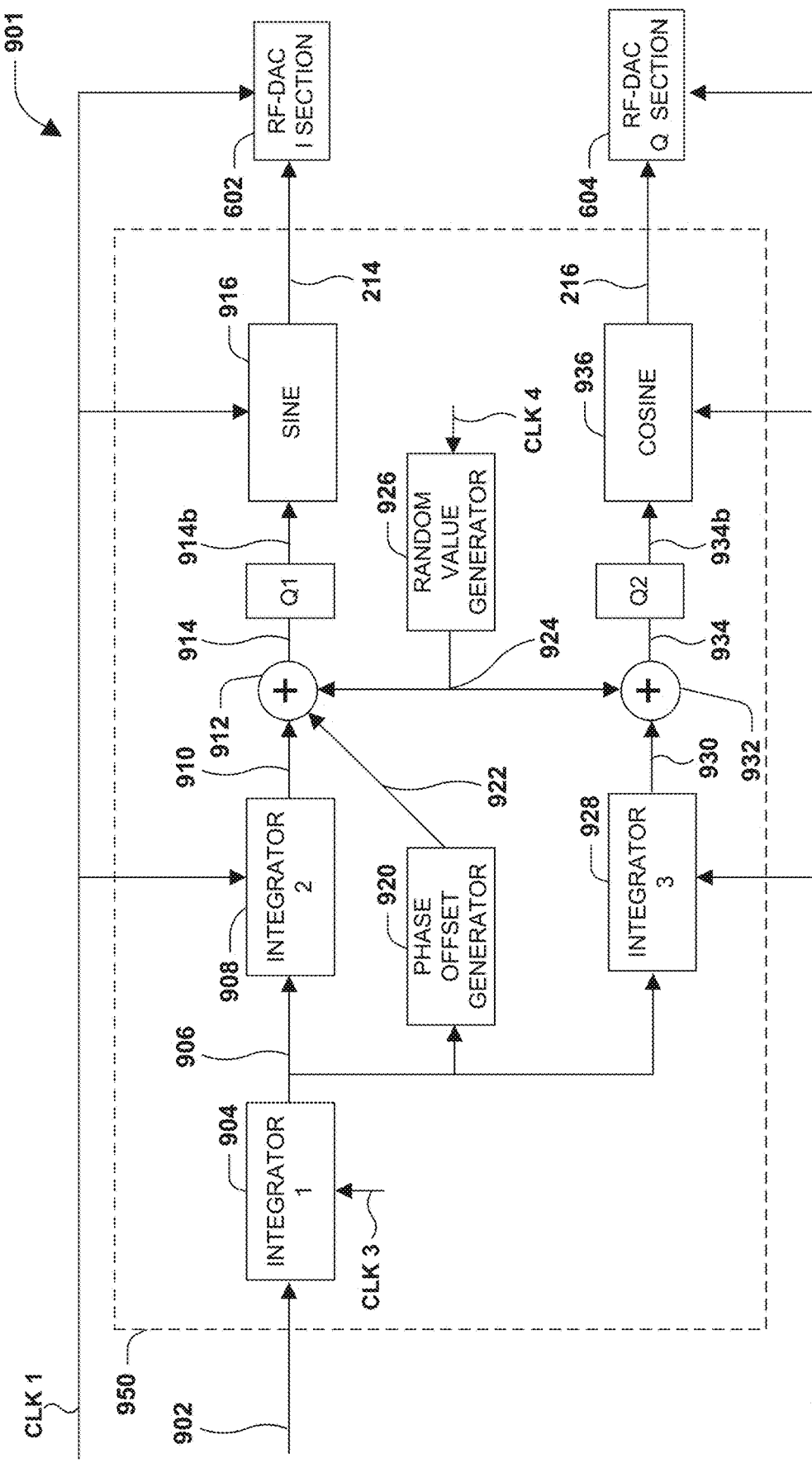

FIG. 9B is an illustration of an example scenario 901 according to an example embodiment in which the example digital signal modulator 950 performs truncation to truncate one or more digital values to one or more truncated digital values. For example, the example digital signal modulator 950 may comprise a first quantizer Q1 and/or a second quantizer Q2 that perform truncation.

In some examples, the first quantizer Q1 truncates first bits indicative of the third digital value 914 to second bits indicative of a truncated third digital value 914b. For example, a quantity of bits of the first bits may be N and a quantity of bits of the second bits may be P (e.g., the second bits may be P most significant bits of the first bits), wherein P is less than N. The truncated third digital value 914b may be provided to the first digital generator 916 (e.g., the first digital generator 916 may generate the first digital value 214 as a sine of the truncated third digital value 914b).

In some examples, the second quantizer Q2 truncates third bits indicative of the fourth digital value 934 to fourth bits indicative of a truncated fourth digital value 934b. For example, a quantity of bits of the third bits may be N and a quantity of bits of the fourth bits may be P (e.g., the fourth bits may be P most significant bits of the third bits), wherein P is less than N. The truncated fourth digital value 934b may be provided to the second digital generator 936 (e.g., the second digital generator 946 may generate the second digital value 216 as a cosine of the truncated fourth digital value 934b).

Figure 10A:
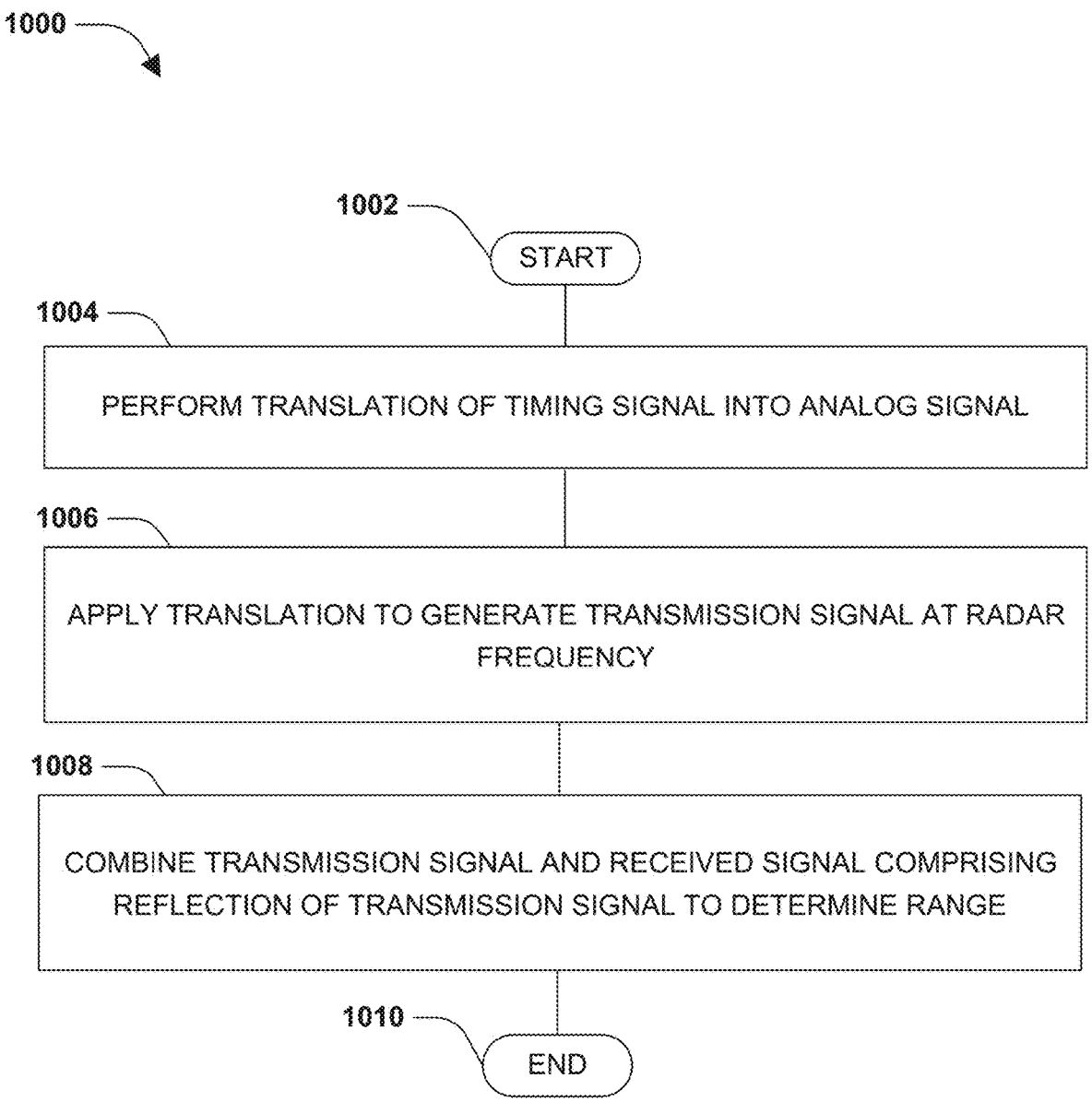
FIGS. 10A-10B illustrate an example method of detecting a range at a radar frequency in accordance with the techniques presented herein.
Figure 10B:
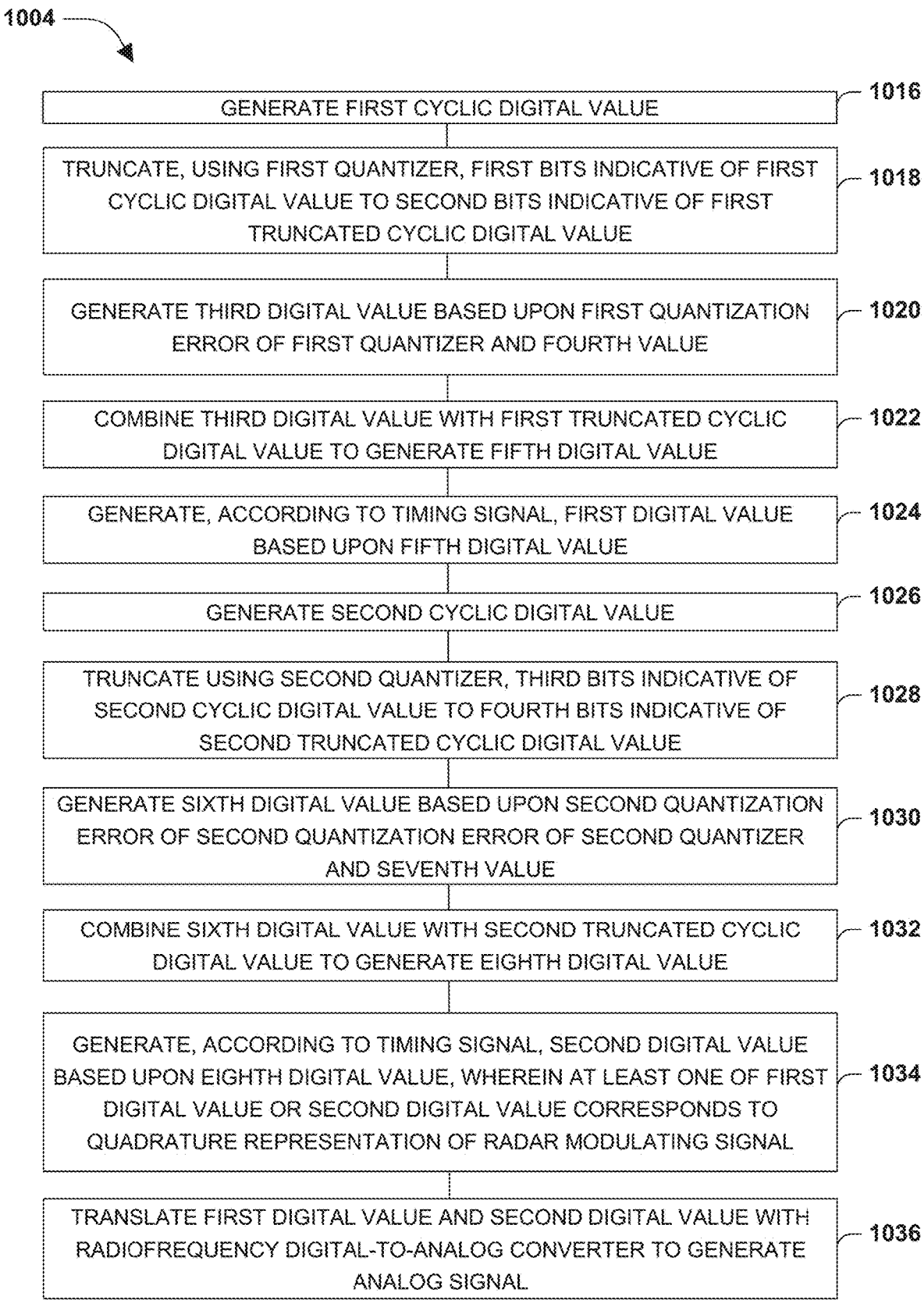

FIGS. 10A-10B is an illustration of a sixth example embodiment of the techniques presented herein, illustrated as an example method 1000 of generating a modulated radar signal and/or detecting a range at a radar frequency. Respective portions of the example method 1000 may involve a device, and may be implemented, e.g., as a set of discrete or integrated electrical and/or electronic components; as a programmable logic circuit, such as a field-programmable gate array (FPGA); and/or as instructions stored in a memory of the device, such as firmware, system memory, a hard disk drive, a solid-state storage component, or a magnetic or optical medium, wherein the execution of the instructions by a processor of the device causes the device to operate in accordance with the techniques presented herein.

The example method 1000 begins at 1002 and involves performing 1004 a translation of a timing signal 204 into an analog signal 220 by performing one or more acts shown in FIG. 10B. At least some of the one or more acts may be performed to generate, according to the timing signal 204, a first digital value 214 and a second digital value 216. The one or more acts of 1004 comprise generating 1016 a first cyclic digital value. Alternatively and/or additionally, the one or more acts of 1004 comprise truncating 1018, using a first quantizer, first bits indicative of the first cyclic digital value to second bits indicative of a first truncated cyclic digital value. For example, a quantity of bits of the first bits may be N and a quantity of bits of the second bits may be P (e.g., the second bits may be P most significant bits of the first bits), wherein P is less than N. Alternatively and/or additionally, the one or more acts of 1004 comprise generating 1020 a third digital value based upon a first quantization error of the first quantizer and a fourth value. For example, the first quantization error may be E least significant bits of the first bits, wherein E may be a difference between N and P (e.g., a quantity of bits of the first quantization error may be E, where E=N−P). The fourth value may be a random value (e.g., a true random value or a pseudo-random value) and/or a noise shaped value. Alternatively and/or additionally, the one or more acts of 1004 may comprise combining 1022 (e.g., summing) the third digital value with the first truncated cyclic digital value to generate a fifth digital value (e.g., the fifth digital value may be a sum of the first truncated cyclic digital value and the third digital value). Alternatively and/or additionally, the one or more acts of 1004 may comprise generating 1024, according to the timing signal 204, the first digital value 214 based upon the fifth digital value. Alternatively and/or additionally, the one or more acts of 1004 may comprise generating 1026 a second cyclic digital value. Alternatively and/or additionally, the one or more acts of 1004 may comprise truncating 1028, using a second quantizer, third bits indicative of the second cyclic digital value to fourth bits indicative of a second truncated cyclic digital value. For example, a quantity of bits of the third bits may be N and a quantity of bits of the fourth bits may be P (e.g., the fourth bits may be P most significant bits of the third bits), wherein P is less than N. Alternatively and/or additionally, the one or more acts of 1004 may comprise generating 1030 a sixth digital value based upon a second quantization error of the second quantizer and a seventh value. For example, the second quantization error may be E least significant bits of the third bits, wherein E may be a difference between N and P (e.g., a quantity of bits of the second quantization error may be E, where E=N−P). The seventh value may be a random value (e.g., a true random value or a pseudo-random value) and/or a noise shaped value. Alternatively and/or additionally, the one or more acts of 1004 may comprise combining 1032 (e.g., summing) the sixth digital value with the second truncated cyclic digital value to generate an eighth digital value (e.g., the eighth digital value may be a sum of the second truncated cyclic digital value and the sixth digital value). Alternatively and/or additionally, the one or more acts of 1004 may comprise generating 1034, according to the timing signal 204, the second digital value 216 based upon the eighth digital value. Alternatively and/or additionally, the one or more acts of 1004 may comprise translating 1036 the first digital value 214 and the second digital value 216 with a radiofrequency digital-to-analog converter 218 to generate the analog signal 220. The example method 1000 also involves applying 1006 the translation to generate a transmission signal (e.g., a radar signal 126 and/or a transmission signal 404) at the radar frequency. The example method 1000 also involves combining 1006 the radar signal 126 and a received signal 130 comprising a reflection of the radar signal 126 to determine a range 140. For example, the radar signal 126 and the received signal 130 may be compared to determine the range 140. According to one example, combining (e.g., comparing) the radar signal 126 and received signal 130 is implemented by mixing or demodulating the transmitted radar signal 126 (or a replica of the transmitted signal having the same signal course) with the received signal 130 using a mixer or an IQ demodulator. In this manner, the example method 1000 enables the determination of a range 140 using a modulated radar signal generated in accordance with the techniques presented herein, and so ends at 1014.

In some examples, an increasing digital value is generated. The increasing digital value may be integrated using a first integrator to generate the first cyclic digital value. The increasing digital value may be integrated using a second integrator to generate the second cyclic digital value.

In some examples, the first digital value 214 is generated as a sine of the fifth digital value.

In some examples, the second digital value 216 is generated as a cosine of the eighth digital value.

Figure 11:
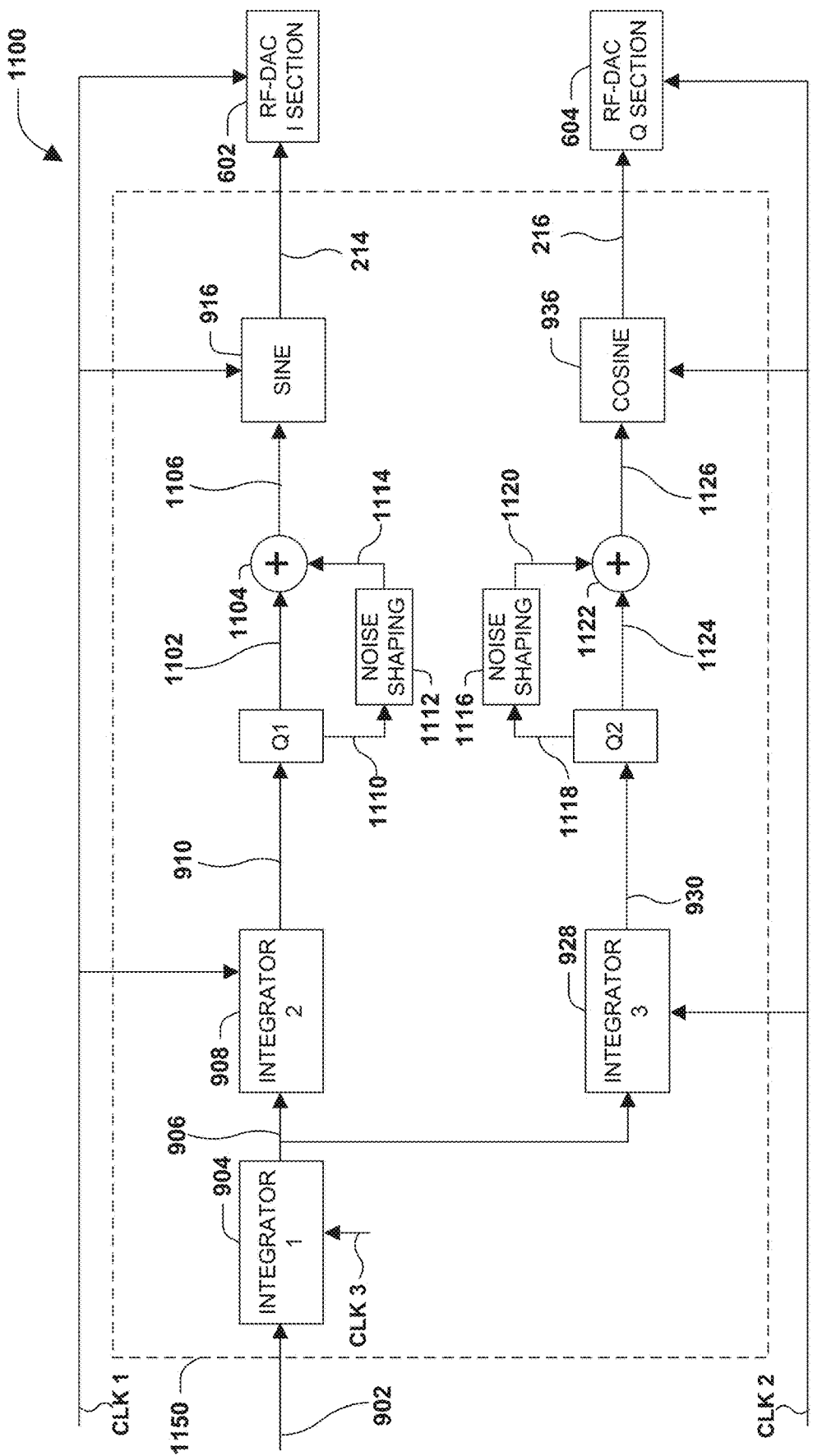
FIG. 11 is a component block diagram illustrating an example digital signal modulator in accordance with the techniques presented herein.

FIG. 11 is an illustration of an example scenario 1100 featuring a seventh example embodiment of the techniques presented herein, wherein the seventh example embodiment comprises an example digital signal modulator 1150 of a radar modulation signal generator (e.g., the example radar modulation signal generator 402) and/or a ramp generator device (e.g., the example ramp generator device 502). In an example, the example digital signal modulator 1150 may correspond to (and/or may be used as) the example digital signal modulator 212 and/or the example ramp generator device 504. In an example, the example digital signal modulator 1150 may comprise a DDFS, such as an NCO-based DDFS.

The example digital signal modulator 1150 may be provided with one or more clock signals comprising a first clock signal CLK 1, a second clock signal CLK 2 and/or a third clock signal CLK 3. For example, the one or more clock signals may be generated by a clock generator 206 (e.g., the clock generator 206 translates a timing signal 204 into the one or more clock signals). In some examples, a phase of the first clock signal CLK 1 and a phase of the second clock signal CLK 2 are in quadrature.

The example digital signal modulator 1150 may generate a first digital value 214 and a second digital value 216, wherein the first digital value 214 and/or the second digital value 216 correspond to a quadrature representation of a modulation signal at a modulation frequency. In some examples, the example digital signal modulator 1150 may generate the first digital value 214 and the second digital value 216 using one or more first clock signals. The one or more first clock signals may comprise the first clock signal CLK 1 and the second clock signal CLK 2. In an example, the example digital signal modulator 1150 may generate the first digital value 214 at the first clock signal CLK 1 and/or may generate the second digital value 216 at the second clock signal CLK 2.

In some examples, the example digital signal modulator 1150 comprises a first integrator 904 (INTEGRATOR 1) (e.g., a frequency accumulator comprising a flip-flop and/or a combination module such as a summer) that generates an increasing digital value 906. For example, the first integrator 904 may integrate delta frequency control word (ΔFCW) 902 to generate the increasing digital value 906 (e.g., the increasing digital value 906 may be frequency control word (FCW), such as a sawtooth shaped FCW). In some examples, the first integrator 904 operates at the third clock signal CLK 3 to generate the increasing digital value 906.

In some examples, the example digital signal modulator 1150 comprises a second integrator 908 (e.g., a phase accumulator comprising a flip-flop and/or a combination module such as a summer) that integrates the increasing digital value 906 to generate a first cyclic digital value 910. In some examples, the second integrator 908 operates at the first clock signal CLK 1 to generate the first cyclic digital value 910 (e.g., the first cyclic digital value 910 may be a phase value).

In some examples, the example digital signal modulator 1150 comprises a first quantizer Q1 that truncates first bits indicative of the first cyclic digital value 910 to second bits indicative of a first truncated cyclic digital value 1102. For example, a quantity of bits of the first bits may be N and a quantity of bits of the second bits may be P (e.g., the second bits may be P most significant bits of the first bits), wherein P is less than N.

In some examples, the example digital signal modulator 1150 comprises a first noise shaping module 1112 that generates a third digital value 1114 based upon a first quantization error 1110 of the first quantizer Q1 and a fourth value. For example, the first quantization error 1110 may be E least significant bits of the first bits, wherein E may be a difference between N and P (e.g., a quantity of bits of the first quantization error 1110 may be E, where E=N−P). The fourth value may be a random value (e.g., a true random value or a pseudo-random value) and/or a noise shaped value.

In some examples, the example digital signal modulator 1150 comprises a first combination module 1104 (e.g., a summer) that combines (e.g., sums) the third digital value 1114 with the first truncated cyclic digital value 1102 to generate a fifth digital value 1106. In an example, the fifth digital value 1106 may be equal to (and/or based upon) a sum of the third digital value 1114 and the first truncated cyclic digital value 1102.

In some examples, the example digital signal modulator 1150 comprises a first digital generator 916 (e.g., a coordinate rotation digital generator) that generates the first digital value 214 as a sine of the fifth digital value 1106. In some examples, the first digital generator 916 operates at the first clock signal CLK 1 to generate the first digital value 214. In some examples, the first digital generator 916 comprises a look-up table of sine values and/or generates the first digital value 214 based upon the look-up table. The first digital value 214 may be provided to the RF-DAC 218, such as to the I-section 602 of the RF-DAC 218.

In some examples, the example digital signal modulator 1150 comprises a third integrator 928 (e.g., a phase accumulator comprising a flip-flop and/or a combination module such as a summer) that integrates the increasing digital value 906 to generate a second cyclic digital value 930. In some examples, the third integrator 928 operates at the second clock signal CLK 2 to generate the second cyclic digital value 930 (e.g., the second cyclic digital value 930 may be a phase value).

In some examples, the example digital signal modulator 1150 comprises a second quantizer Q2 that truncates third bits indicative of the second cyclic digital value 930 to fourth bits indicative of a second truncated cyclic digital value 1124. For example, a quantity of bits of the third bits may be N and a quantity of bits of the fourth bits may be P (e.g., the fourth bits may be P most significant bits of the third bits), wherein P is less than N.

In some examples, the example digital signal modulator 1150 comprises a second noise shaping module 1116 that generates a sixth digital value 1120 based upon a second quantization error 1118 of the second quantizer Q2 and a seventh value. For example, the second quantization error 1118 may be E least significant bits of the third bits, wherein E may be a difference between N and P (e.g., a quantity of bits of the second quantization error 1118 may be E, where E=N−P). The seventh value may be a random value (e.g., a true random value or a pseudo-random value) and/or a noise shaped value.

In some examples, the example digital signal modulator 1150 comprises a second combination module 1122 (e.g., a summer) that combines (e.g., sums) the sixth digital value 1120 with the second truncated cyclic digital value 1124 to generate an eighth digital value 1126. In an example, the eighth digital value 1126 may be equal to (and/or based upon) a sum of the sixth digital value 1120 and the second truncated cyclic digital value 1124.

In some examples, the example digital signal modulator 1150 comprises a second digital generator 936 (e.g., a coordinate rotation digital generator) that generates the second digital value 216 as a cosine of the eighth digital value 1126. In some examples, the second digital generator 936 operates at the second clock signal CLK 2 to generate the second digital value 216. In some examples, the second digital generator 936 comprises a look-up table of cosine values and/or generates the second digital value 216 based upon the look-up table. The second digital value 216 may be provided to the RF-DAC 218, such as to the Q-section 604 of the RF-DAC 218.

In some examples, the RF-DAC 218 converts, using one or more second clock signals, the first digital value 214 and the second digital value 216 to produce a transmission signal (e.g., an analog radio frequency signal, a radar signal 126 and/or a transmission signal 404) comprising a frequency ramp in accordance with the techniques presented herein. In some examples, the one or more second clock signals are different than the one or more first clock signals. The RF-DAC 218 may operate at the one or more second clock signals to convert the first digital value 214 and the second digital value 216 to produce the transmission signal. Alternatively and/or additionally, the one or more second clock signals may be the same as the one or more first clock signals. In an example, the I-section 602 of the RF-DAC 218 may operate at the first clock signal CLK 1 and the Q-section 604 of the RF-DAC 218 may operate at the second clock signal CLK 2 (to convert the first digital value 214 and the second digital value 216 to produce the transmission signal, for example).

Figure 12A:
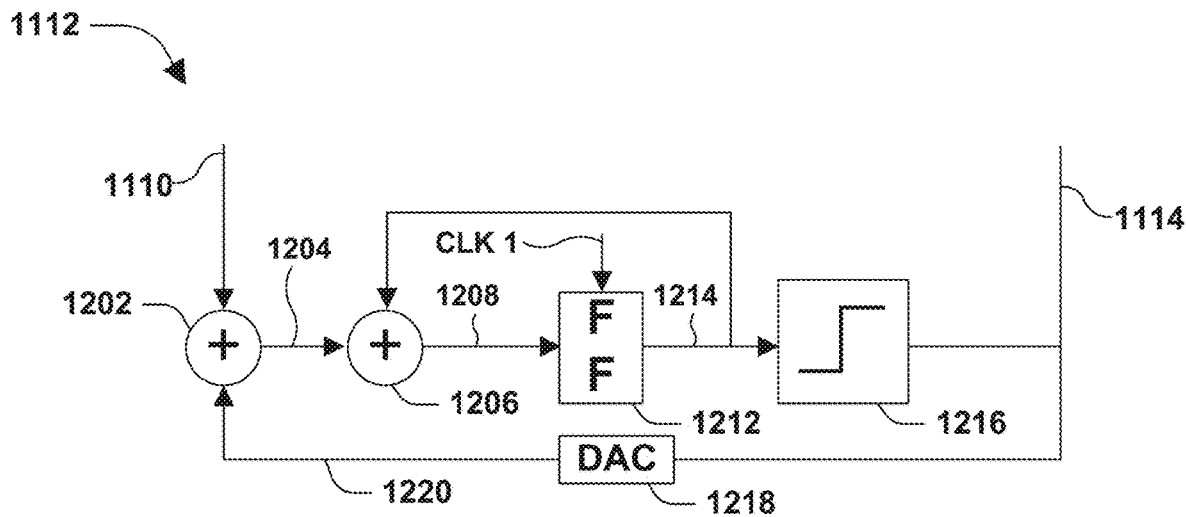
FIGS. 12A-12B are component block diagrams illustrating noise shaping modules in accordance with the techniques presented herein.
Figure 12B:
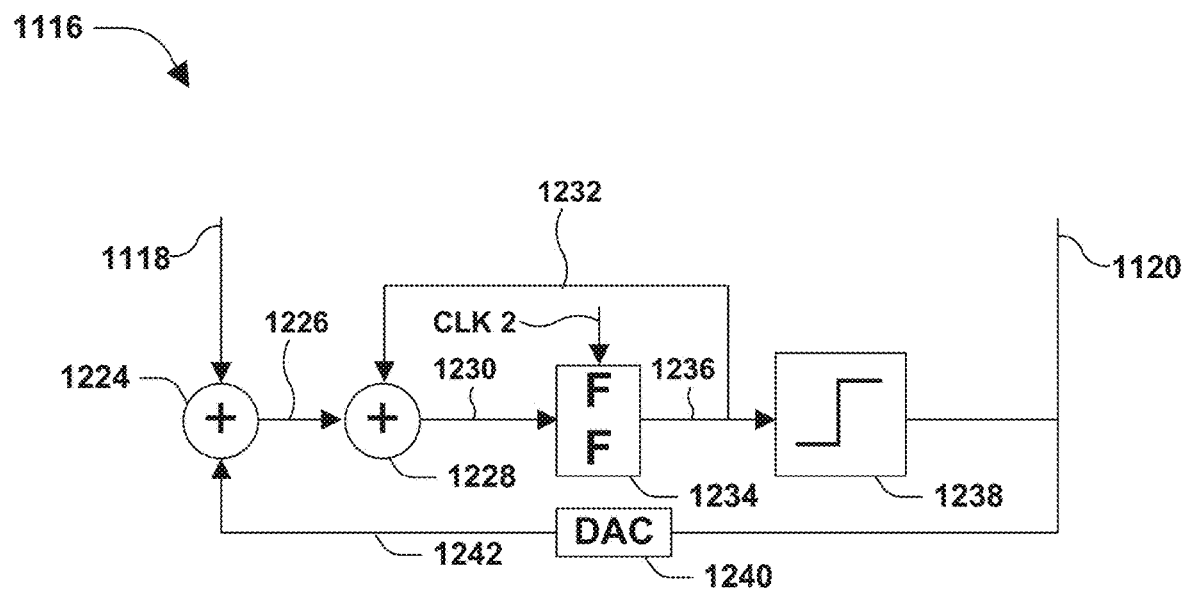

FIGS. 12A-12B illustrate examples of the first noise shaping module 1112 and the second noise shaping module 1116. The first noise shaping module 1112 shown in FIG. 12A is a first-order sigma-delta noise shaping module. Embodiments are contemplated in which the first noise shaping module 1112 is different than a first-order noise shaping module (e.g., the first noise shaping module 1112 may be a second-order, third-order, etc. noise shaping module). Embodiments are contemplated in which the first noise shaping module 1112 is a different type of noise shaping module (other than a sigma-delta noise shaping module). In an example in which the first noise shaping module 1112 is a first-order noise shaping module, the third digital value 1114 generated by the first noise shaping module 1112 may be a one-bit value. The first noise shaping module 1112 may comprise a third combination module 1202 (e.g., a summer) that combines the first quantization error 1110 with the fourth value (shown with reference number 1220) to generate a ninth value 1204. In an example, the ninth value 1204 may be equal to (and/or based upon) the first quantization error 1110 subtracted by the fourth value 1220. The fourth value 1220 (e.g., a noise shaped value and/or a random value such as a true random value or a pseudo-random value) may be provided by a first DAC 1218. For example, the first DAC 1218 may generate the fourth value 1220 based upon an output of the first noise shaping module 1112 (e.g., the output may correspond to the third digital value 1114). In some examples, the first noise shaping module 1112 may comprise a first flip-flop 1212. The first flip-flop 1212 may operate at the first clock signal CLK 1. In some examples, the first flip-flop 1212 may provide a first flip-flop output value 1214 to a third quantizer 1216. For example, the first flip-flop 1212 may generate the first flip-flop output value 1214 based upon a tenth value 1208 generated by a fourth combination module 1206 (e.g., the tenth value 1208 may correspond to a combination of the ninth value 1204 and an output of the first flip-flop 1212). In some examples, the fourth combination module 1206 and the first flip-flop 1212 form an integrator. In some examples, the third quantizer 1216 may generate the third digital value 1114 based upon the first flip-flop output value 1214. In an example in which the third digital value 1114 is a one-bit value, the third quantizer 1216 may generate the third digital value 1114 as 1 (or 0) based upon the first flip-flop output value 1214 being less than a threshold and/or the third quantizer 1216 may generate the third digital value 1114 as 1 (or 0) based upon the first flip-flop output value 1214 meeting the threshold. In some examples, the third digital value 1114 may be a random value (e.g., a true random value or a pseudo-random value) and/or a noise shaped value.

The second noise shaping module 1116 shown in FIG. 12B is a first-order sigma-delta noise shaping module. Embodiments are contemplated in which the second noise shaping module 1116 is different than a first-order noise shaping module (e.g., the second noise shaping module 1116 may be a second-order, third-order, etc. noise shaping module). Embodiments are contemplated in which the second noise shaping module 1116 is a different type of noise shaping module (other than a sigma-delta noise shaping module). In an example in which the second noise shaping module 1116 is a first-order noise shaping module, the sixth digital value 1120 generated by the second noise shaping module 1116 may be a one-bit value. The second noise shaping module 1116 may comprise a fifth combination module 1224 (e.g., a summer) that combines (e.g., sums) the second quantization error 1118 with the seventh value (shown with reference number 1242) to generate an eleventh value 1226. In an example, the eleventh value 1226 may be equal to (and/or based upon) the second quantization error 1118 subtracted by the seventh value 1242. The seventh value 1242 (e.g., a noise shaped value and/or a random value such as a true random value or a pseudo-random value) may be provided by a second DAC 1240. For example, the second DAC 1240 may generate the seventh value 1242 based upon an output of the second noise shaping module 1116 (e.g., the output may correspond to the sixth digital value 1120). In some examples, the second noise shaping module 1116 may comprise a second flip-flop 1234. The second flip-flop 1234 may operate at the second clock signal CLK 2. In some examples, the second flip-flop 1234 may provide a second flip-flop output value 1236 to a fourth quantizer 1238. For example, the second flip-flop 1234 may generate the second flip-flop output value 1236 based upon a twelfth value 1230 generated by a sixth combination module 1228 (e.g., the twelfth value 1230 may correspond to a combination of the eleventh value 1226 and an output of the second flip-flop 1234). In some examples, the sixth combination module 1228 and the second flip-flop 1234 form an integrator. In some examples, the fourth quantizer 1238 may generate the sixth digital value 1120 based upon the second flip-flop output value 1236. In an example in which the sixth digital value 1120 is a one-bit value, the fourth quantizer 1238 may generate the sixth digital value 1120 as 1 (or 0) based upon the second flip-flop output value 1236 being less than a threshold and/or the fourth quantizer 1238 may generate the sixth digital value 1120 as 1 (or 0) based upon the second flip-flop output value 1236 meeting the threshold. In some examples, the sixth digital value 1120 may be a random value (e.g., a true random value or a pseudo-random value) and/or a noise shaped value.

Figure 13:
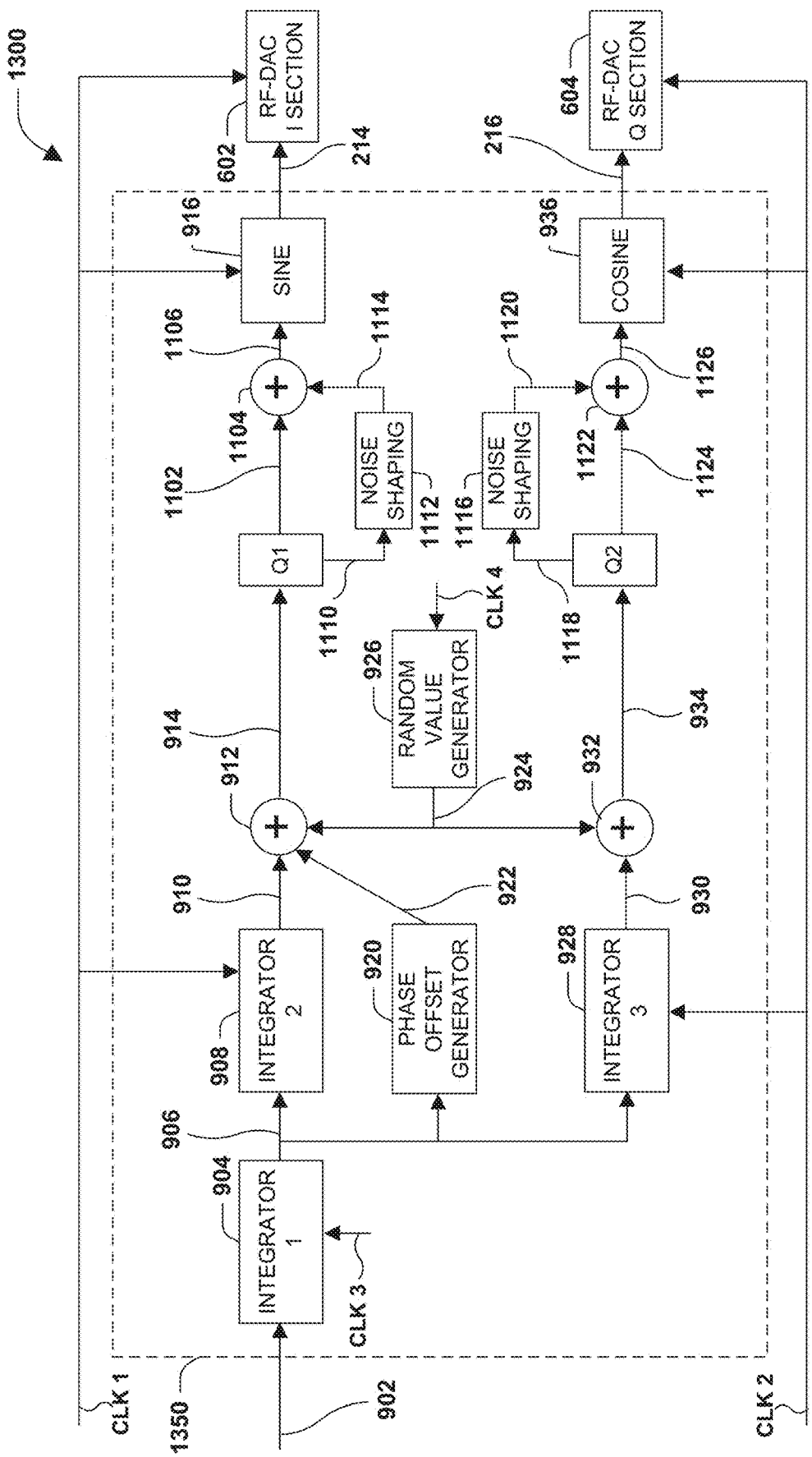
FIG. 13 is a component block diagram illustrating an example digital signal modulator in accordance with the techniques presented herein.

In some implementations, aspects of the example digital signal modulator 950 of FIGS. 9A-9B and the example digital signal modulator 1150 of FIG. 11 may be combined. For example, FIG. 13 is an illustration of an example scenario 1300 featuring an eighth example embodiment of the techniques herein, wherein the eighth example embodiment comprises an example digital signal modulator 1350 of a radar modulation signal generator (e.g., the example radar modulation signal generator 402) and/or a ramp generator device (e.g., the example ramp generator device 502). In an example, the example digital signal modulator 1350 may correspond to (and/or may be used as) the example digital signal modulator 212 and/or the example ramp generator device 504. In an example, the example digital signal modulator 1150 may comprise a DDFS, such as an NCO-based DDFS. The example digital signal modulator 1150 may comprise one or more components (e.g., at least one of the phase offset generator 920, the random value generator 926, the first quantizer Q1, the second quantizer Q2, the first noise shaping module 1112, the second noise shaping module 1116, etc.) of the example digital signal modulator 950 and the example digital signal modulator 1150. In an example shown in FIG. 13, the first combination module 912 may provide the third digital value 914 as an input to the first quantizer Q1, and/or the second combination module 932 may provide the fourth digital value 934 as an input to the second quantizer Q2.

H. FURTHER TECHNICAL EFFECTS

Some embodiments of generating a first digital value 212 and a second digital value 214 in accordance with the techniques presented herein may enable a variety of technical features with respect to other embodiments that do not use the techniques presented herein.

Truncation (e.g., quantization using the first quantizer Q1 and/or the second quantizer Q2) of digital values (e.g., cyclic digital values, such as phase values) provides for reduced cost, reduced power consumption, reduced hardware size and/or reduced hardware complexity (due to reducing a number of bits of digital values from N to P, for example). In an example, in order to reduce a number of bits of digital values from N to P (e.g., to satisfy one or more constraints, such as a hardware complexity constraint of the digital signal modulator and/or a hardware size constraint of the digital signal modulator), it may be necessary and/or mandatory that a digital signal modulator (e.g., a DDFS) perform quantization. However, the quantization may introduce a periodic truncation error that is based upon a quantization error of the quantization and/or a quantity of truncated bits of the quantization (e.g., in an example in which the quantization is performed to truncate N bits to P bits, the quantity of truncated bits may be a difference between N and P), wherein the periodic truncation error may result in noise and/or spurs.

A fourth technical effect that may be exhibited by a transmission signal (e.g., an analog radio frequency signal, a radar signal 126 and/or a transmission signal 404) modulated in accordance with the techniques presented herein involves the mitigation and/or avoidance of noise and/or spurs introduced by the quantization of digital values (e.g., phase values). Accordingly, using one or more of the techniques herein, quantization may be used to reduce cost, power consumption and/or hardware, while avoiding and/or mitigating noise and/or spurs associated with the quantization.

Figure 14:
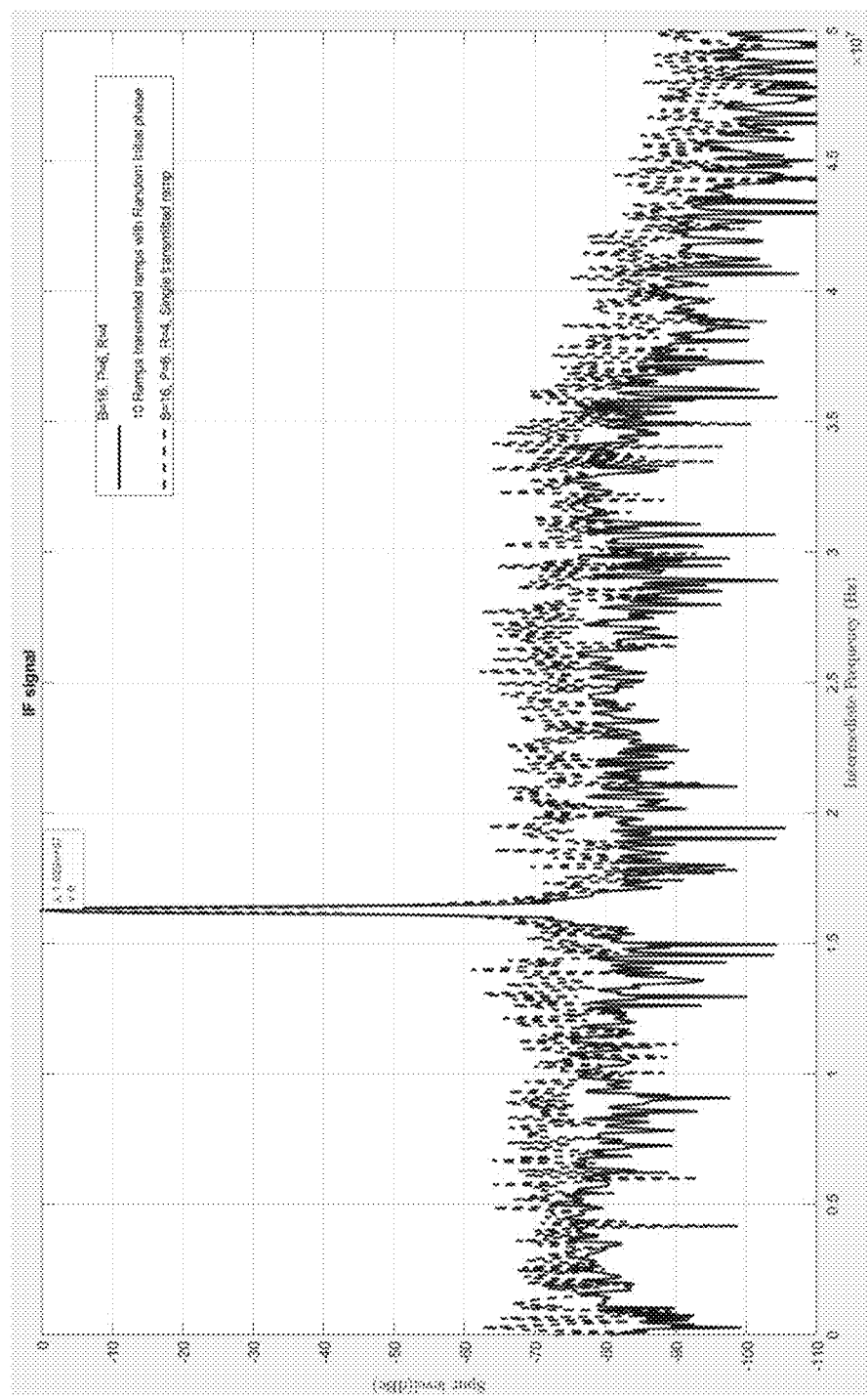
FIG. 14 is a data set illustrating intermediate signals in accordance with the techniques presented herein.

The mitigation and/or avoidance of noise and/or spurs may be a result of generating the first digital value 214 and the second digital value 216 based upon a random phase value (e.g., an initial random phase value), such as the random phase value 924 (e.g., combining a phase value, such as the first cyclic digital value 910, with the random phase value), such as by adding a random phase value (e.g., an initial random phase value) at the start of each frequency ramp generated using the first digital value 214 and the second digital value 216. FIG. 14 provides an example data set 1400 that demonstrates an effect, on spur levels, of adding random phase values at the start of frequency ramps using one or more of the techniques herein. In the example data set 1400 of FIG. 14, the solid curve represents a first intermediate signal (at intermediate frequencies) generated using the first digital value 214 and the second digital value 216 based upon a random phase value according to one or more of the techniques herein. The dotted curve represents a second intermediate signal (at intermediate frequencies) generating without using a random phase value according to one or more of the techniques herein. A vertical axis of the example data set 1400 may correspond to spur levels (in units of decibels relative to carrier (dBc)). A horizontal axis of the example data set 1400 may correspond to frequency (in units of $10^7$ hertz). The first intermediate signal and the second intermediate signal may be associated with B=16, P=6 and R=4, where B corresponds to a quantity of bits for phase resolution (e.g., a quantity of bits of first bits indicative of a first cyclic digital value 910 and/or a quantity of bits of third bits indicative of a second cyclic digital value 930), P corresponds to a quantity of bits for quantized phase resolution (e.g., a quantity of bits of second bits indicative of a first truncated cyclic digital value 1102 and/or a quantity of bits of fourth bits indicative of a second truncated cyclic digital value 1124) and/or R corresponds to a quantity of bits used for RF-DAC amplitude resolution. The first intermediate signal is processed from 10 ramps (e.g., ramp signals with 10 frequency ramps) transmitted with 10 random initial phases (e.g., each frequency ramp of the 10 frequency ramps is transmitted with a random initial phase of the 10 random initial phases). The second intermediate signal is processed from a single ramp signal. The first intermediate signal shows an improvement in signal-to-noise ratio by between 5 and 15 decibels (e.g., about 10 decibels) as compared to the second intermediate signal.

Alternatively and/or additionally, the mitigation and/or avoidance of noise and/or spurs may be a result of generating the first digital value 214 and the second digital value 216 by performing noise shaping (using the first noise shaping module 1112 and/or the second noise shaping module 1116, for example).

Figure 15A:
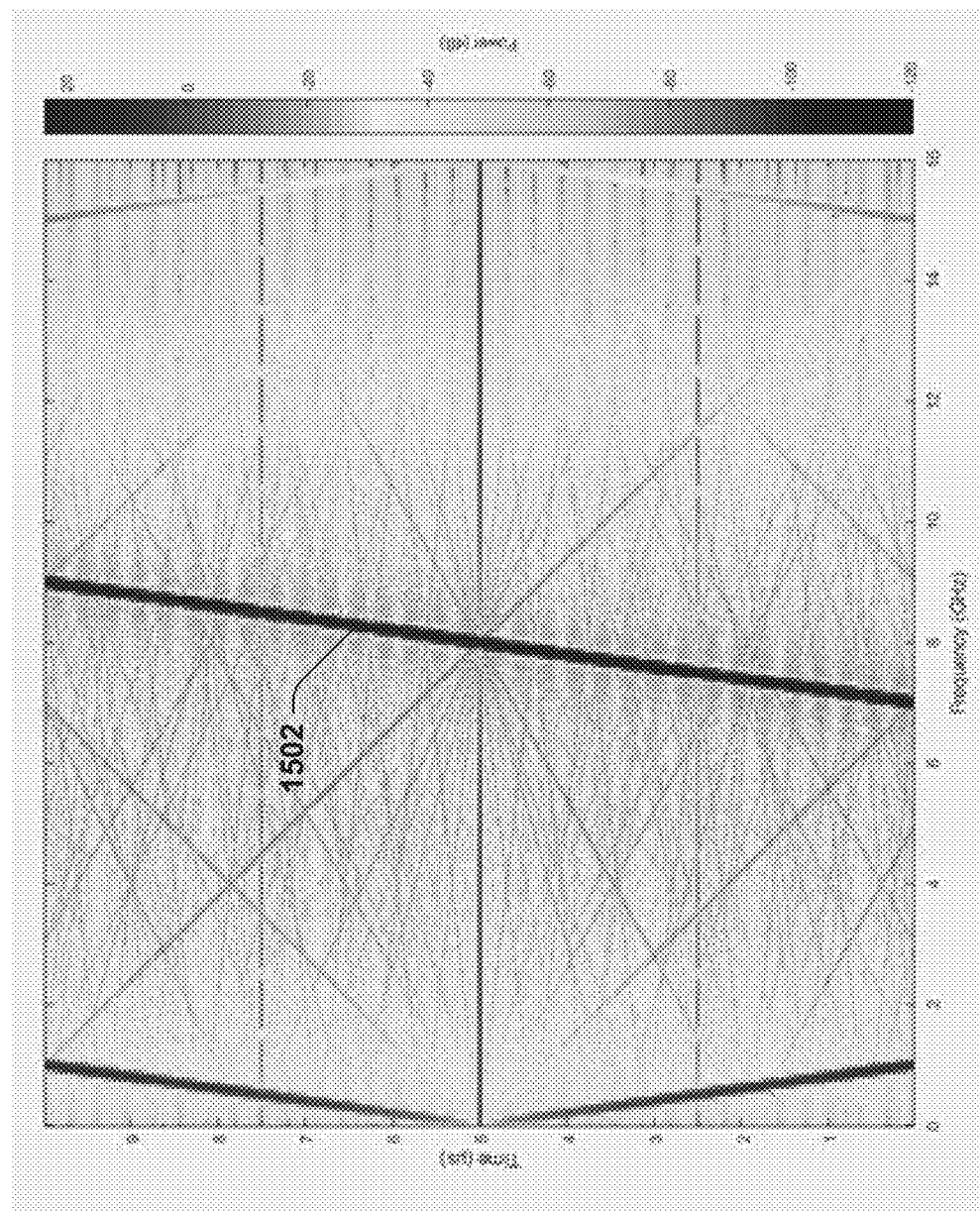
FIGS. 15A-15B are spectrograms illustrating ramp signals in accordance with the techniques presented herein.
Figure 15B:
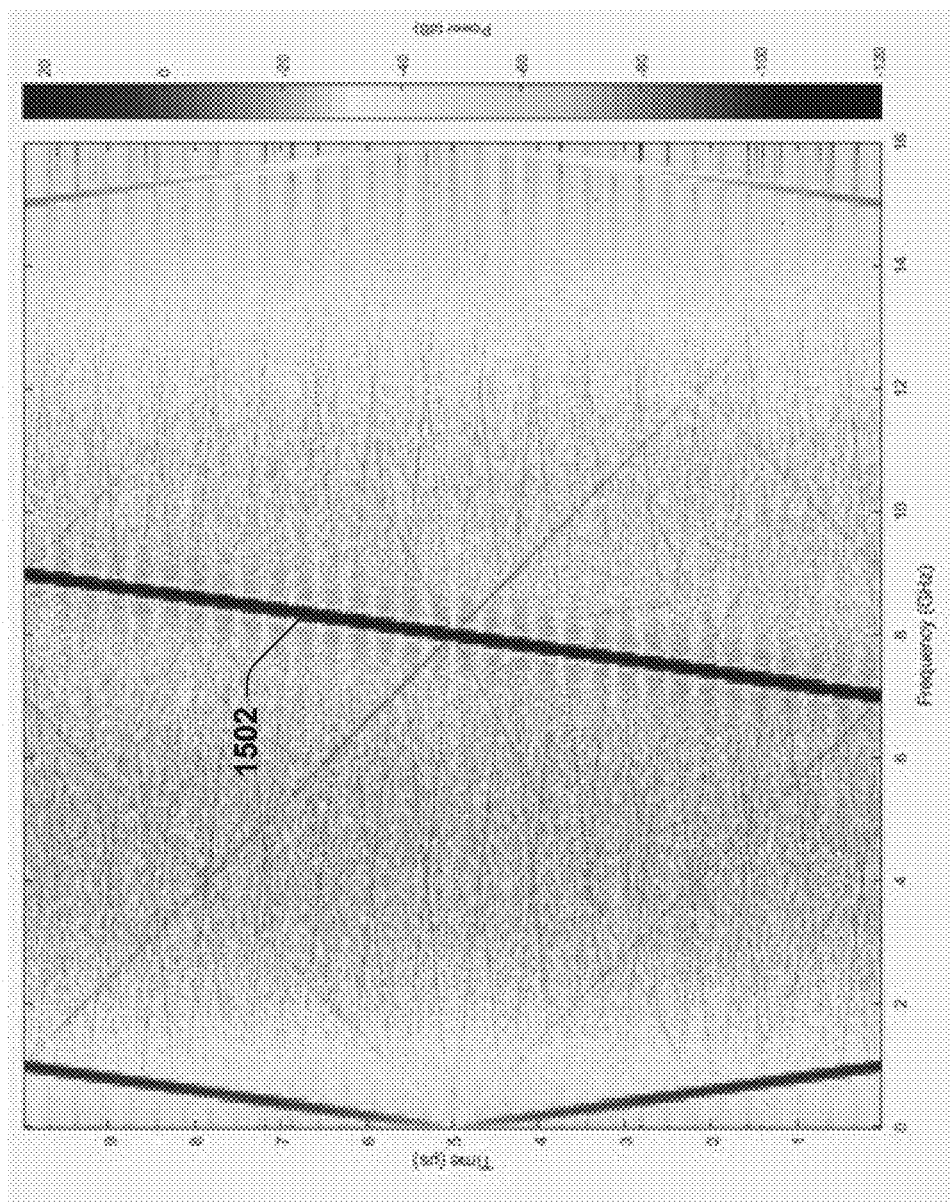

FIGS. 15A-15B provide example spectrograms that demonstrate an effect, on spur levels, of generating signal ramps based upon digital values (e.g., the first digital value 214 and/or the second digital value 216) that are generated via noise shaping using one or more of the techniques herein. Vertical axes of the example spectrograms may correspond to time (in units of microseconds). Horizontal axes of the example spectrograms may correspond to frequency (in units of gigahertz). Color intensity of the example spectrograms change with power. The first example spectrogram 1500 of FIG. 15A and the second example spectrogram 1550 of FIG. 15B show a desired ramp 1502 from 7 gigahertz to 9 gigahertz in a duration of 10 microseconds. The first example spectrogram 1500 is representative of a first ramp signal (e.g., a transmission signal, such as an analog radio frequency signal, a radar signal 126 and/or a transmission signal 404) that is generated without using the techniques presented herein to perform noise shaping. The second example spectrogram 1550 is representative of a second ramp signal (e.g., a transmission signal, such as an analog radio frequency signal, a radar signal 126 and/or a transmission signal 404) that is generated with noise shaping according to one or more of the techniques herein (e.g., using the first noise shaping module 1112 and/or the second noise shaping module 1116). The first ramp signal and the second ramp signal may be associated with N=16, P=6 and R=4, where N corresponds to a quantity of bits for phase resolution (e.g., a quantity of bits of first bits indicative of a first cyclic digital value 910 and/or a quantity of bits of third bits indicative of a second cyclic digital value 930), P corresponds to a quantity of bits for quantized phase resolution (e.g., a quantity of bits of second bits indicative of a first truncated cyclic digital value 1102 and/or a quantity of bits of fourth bits indicative of a second truncated cyclic digital value 1124) and/or R corresponds to a quantity of bits used for RF-DAC amplitude resolution. As shown in the example spectrograms of FIGS. 15A-15B, a spectral purity of the second ramp signal is improved as compared to the first ramp signal. For example, as compared to the second ramp signal of FIG. 15B, the first ramp signal of FIG. 15A exhibits more undesired frequency ramps centered around 8 gigahertz at lower power levels (such as due to spurs caused by phase truncation error). However, in the second ramp signal, a periodic phase truncation error is mitigated and/or avoided due to noise shaping.

Figure 16:
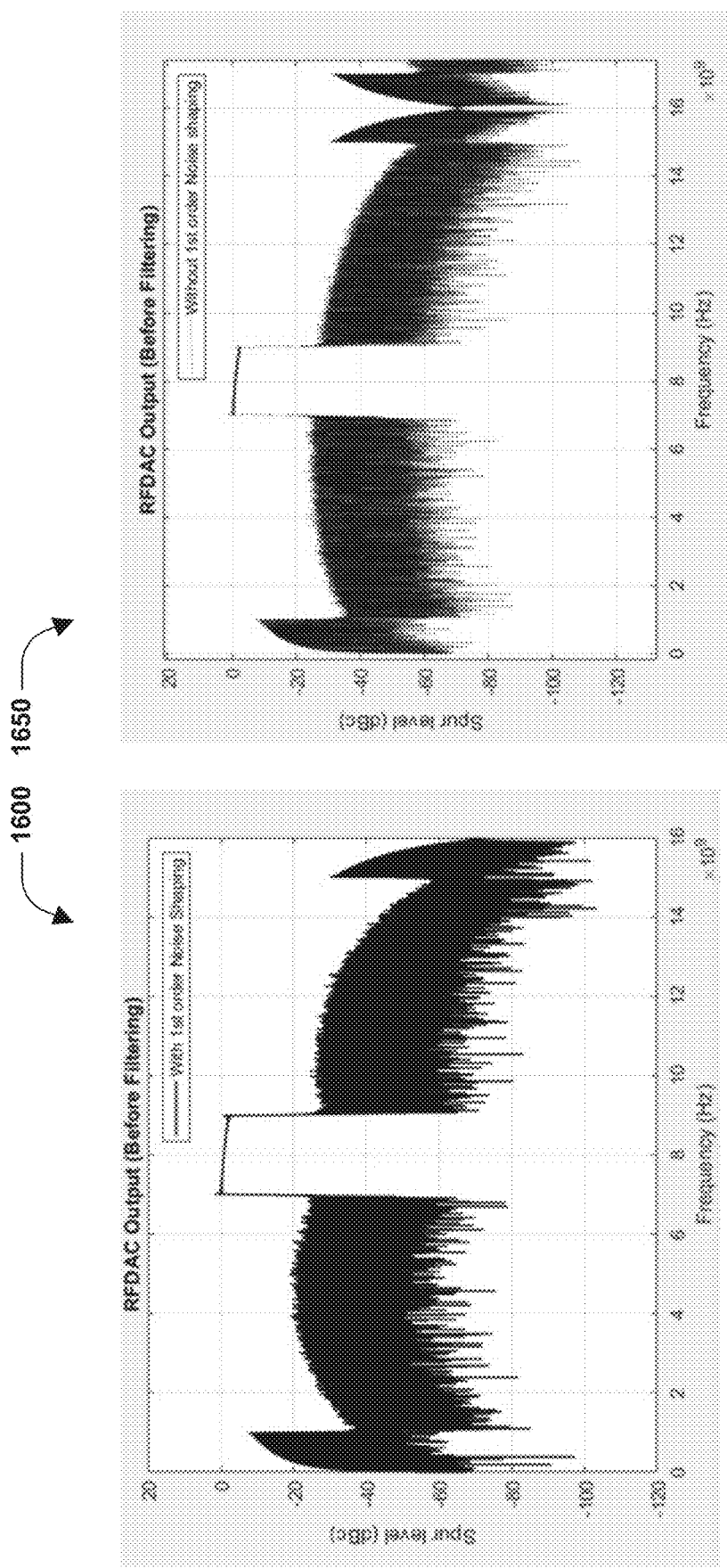
FIG. 16 is a data set illustrating radiofrequency digital-to-analog converter (RF-DAC) outputs in accordance with the techniques presented herein.

FIG. 16 provides example data sets that demonstrate an effect, on spur levels, of generating signal ramps based upon digital values (e.g., the first digital value 214 and/or the second digital value 216) that are generated by performing noise shaping using one or more of the techniques herein. Vertical axes of the example data sets may correspond to spur levels (in units of decibels relative to carrier (dBc)). Horizontal axes of the example data sets may correspond to frequency (in units of gigahertz). The first example data set 1600 of FIG. 16 shows a solid curve representative of a first RF-DAC output (e.g., output of the RF-DAC 218 before filtering, for example) generated based upon the first digital value 214 and the second digital value 216 that are generated by performing noise shaping (e.g., first-order noise shaping performed by the first noise shaping module 1112 and/or the second noise shaping module 1116). The second example data set 1650 of FIG. 16 shows a dotted curve representative of a second RF-DAC output (e.g., output of the RF-DAC 218 before filtering, for example) generated based upon the first digital value 214 and the second digital value 216 without using the techniques presented herein to perform noise shaping. For example, the solid curve of the first example data set 1600 may be a Fast Fourier Transform (FFT) of the first RF-DAC output and the dotted curve of the second example data set 1650 may be an FFT of the second RF-DAC output. As shown in the first example data set 1600 and the second example data set 1650, noise of the first RF-DAC output may be shifted to higher frequencies as compared to the second RF-DAC output, such as due to a low pass filter effect of a feedback loop associated with noise shaping (e.g., a feedback loop of the first noise shaping module 1112 and/or the second noise shaping module 1116).

Figure 17:
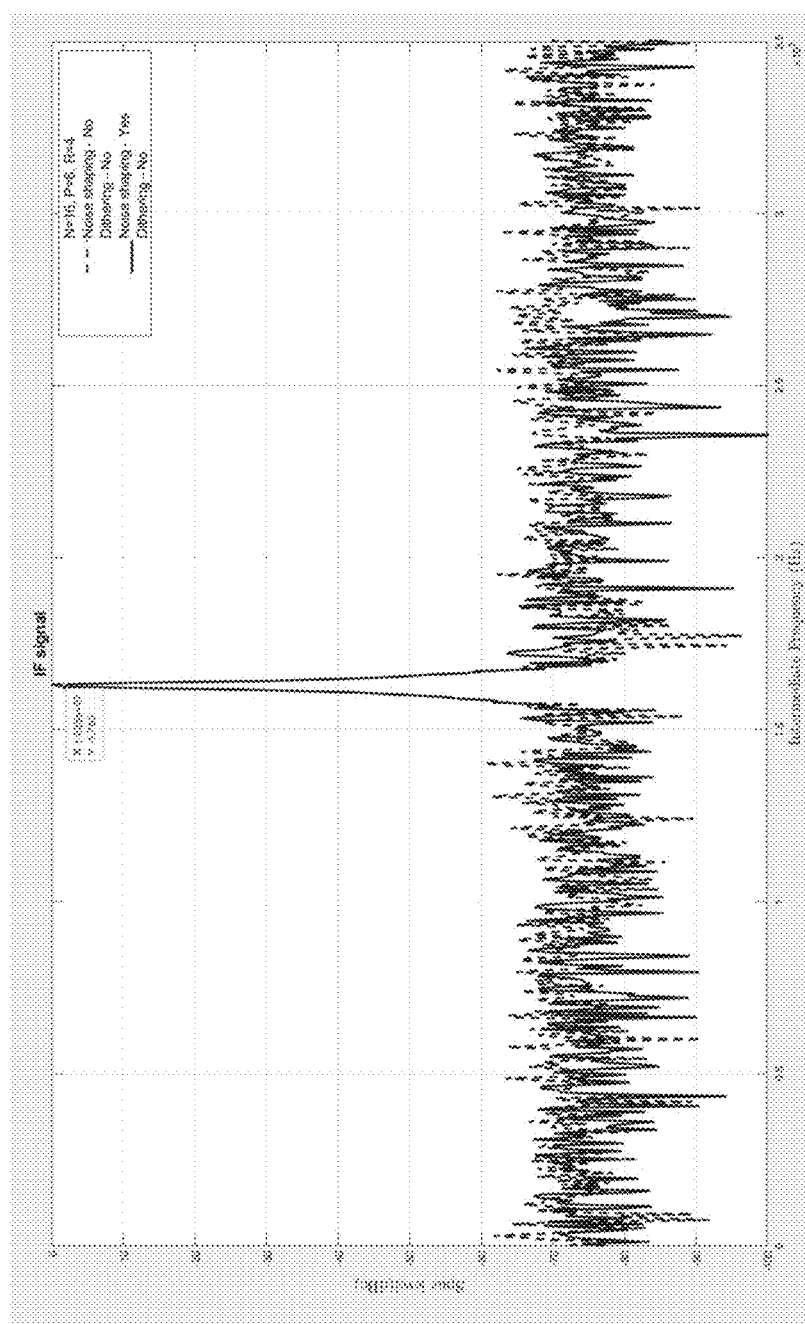
FIG. 17 is a data set illustrating intermediate signals in accordance with the techniques presented herein.
Figure 18:
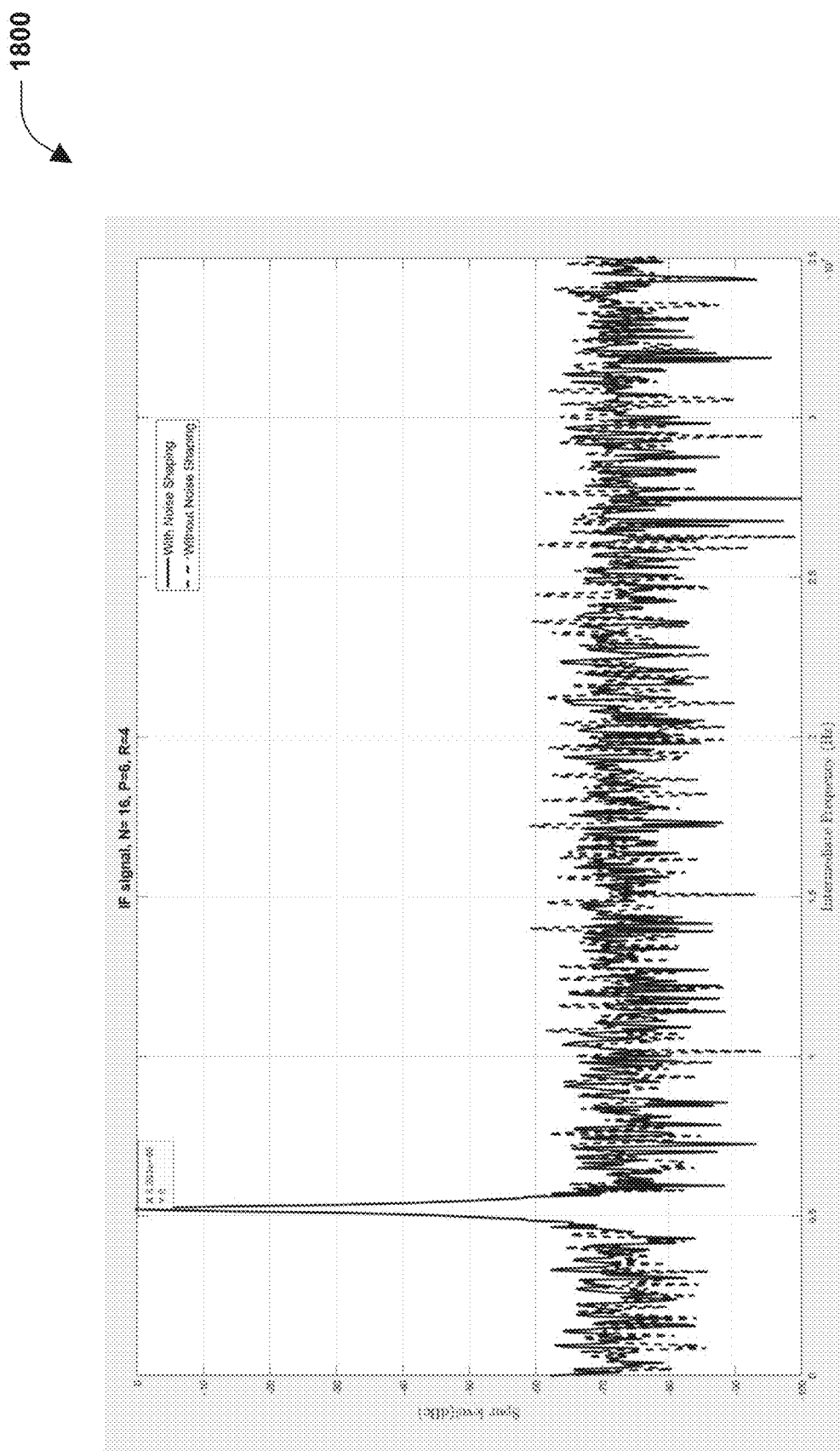
FIG. 18 is a data set illustrating intermediate signals in accordance with the techniques presented herein.
Figure 19:
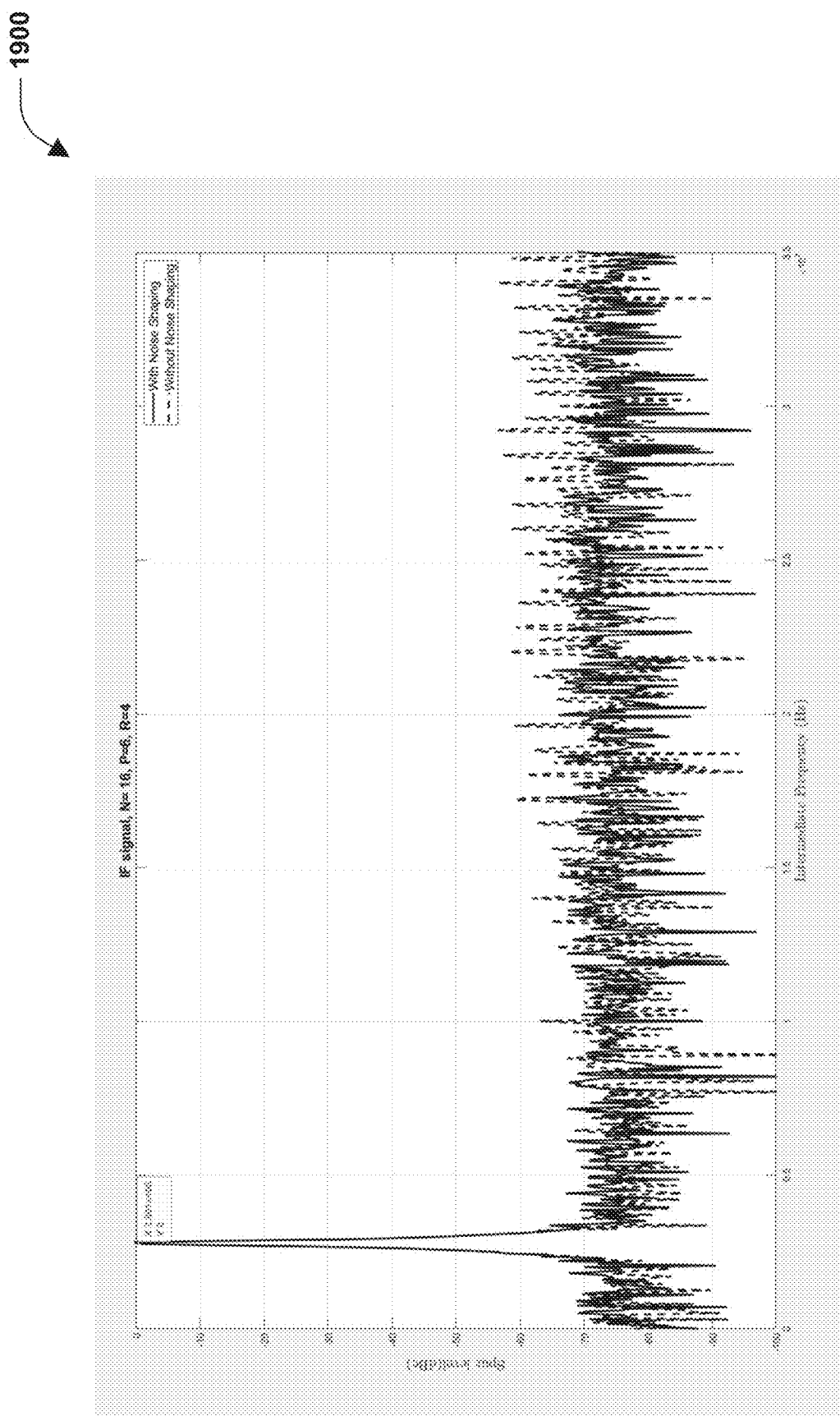
FIG. 19 is a data set illustrating intermediate signals in accordance with the techniques presented herein.

FIGS. 17-19 provide example data sets that demonstrate an effect, on spur levels, of generating signal ramps based upon digital values (e.g., the first digital value 214 and/or the second digital value 216) that are generated by performing noise shaping using one or more of the techniques herein. Vertical axes of the example data sets in FIGS. 17-19 may correspond to spur levels (in units of decibels relative to carrier (dBc)). Horizontal axes of the example data sets in FIGS. 17-19 may correspond to frequency (in units of $10^7$ hertz). The example data sets of FIGS. 17-19 comprise curves representative of intermediate signals (at intermediate frequencies). An intermediate signal of the intermediate signals (and/or each intermediate signal of the intermediate signals) is processed by (i) transmitting a ramp signal comprising one or more frequency ramps via a transmitter, wherein the ramp signal is reflected by a target, (ii) down-converting in frequency the reflected ramp signal using a mixer, and/or (iii) using a processing unit (e.g., a baseband processing unit) to generate an FFT (e.g., a 1-dimensional FFT) from an output signal of the mixer. The intermediate signals may be associated with N=16, P=6 and R=4, where N corresponds to a quantity of bits for phase resolution (e.g., a quantity of bits of first bits indicative of a first cyclic digital value 910 and/or a quantity of bits of third bits indicative of a second cyclic digital value 930), P corresponds to a quantity of bits for quantized phase resolution (e.g., a quantity of bits of second bits indicative of a first truncated cyclic digital value 1102 and/or a quantity of bits of fourth bits indicative of a second truncated cyclic digital value 1124) and/or R corresponds to a quantity of bits used for RF-DAC amplitude resolution. Target ranges of the example data sets of FIGS. 18-19 may be smaller than a target range of the example data set of FIG. 17.

In the example data sets 1700, 1800 and 1900 of FIGS. 17-19, the solid curves represent first intermediate signals that are based upon the first digital value 214 and the second digital value 216, wherein the first digital value 214 and the second digital value 216 are generated by performing noise shaping using one or more of the techniques herein. The dotted curves represent second intermediate signals that are based upon the first digital value 214 and the second digital value 216, wherein the first digital value 214 and the second digital value 216 are generated without using the techniques presented herein to perform noise shaping.

I. CLAIM SUMMARY

An embodiment of the presently disclosed techniques comprises a method of detecting a range at a radar frequency. The method comprises: performing a translation of a timing signal into an analog signal by: generating, according to the timing signal, a first digital value and a second digital value based upon a random phase value, and translating the first digital value and the second digital value with a radiofrequency digital-to-analog converter to generate the analog signal, wherein the first digital value and/or the second digital value correspond to a quadrature representation of a radar modulating signal; applying the translation to generate a transmission signal at the radar frequency; and combining the transmission signal and a received signal comprising a reflection of the transmission signal to determine the range.

An embodiment of the presently disclosed techniques comprises an apparatus for determining a range at a radar frequency. The apparatus comprises: means for performing a translation of a timing signal into an analog signal by: generating, according to the timing signal, a first digital value and a second digital value based upon a random phase value, and translating the first digital value and the second digital value with a radiofrequency digital-to-analog converter to generate the analog signal, wherein the first digital value and/or the second digital value correspond to a quadrature representation of a radar modulating signal; means for applying the translation to generate a transmission signal at the radar frequency; and means for combining the transmission signal and a received signal comprising a reflection of the transmission signal to determine the range.

An embodiment of the presently disclosed techniques comprises a ramp generator device, comprising: a phase-locked loop that provides a timing signal; a clock generator that translates the timing signal into a plurality of clock signals comprising one or more first clock signals and one or more second clock signals; a digital ramp generator that, using the one or more first clock signals, generates a first digital value and a second digital value based upon a random phase value, wherein the first digital value and/or the second digital value correspond to a quadrature representation of a ramp modulation signal; and a radiofrequency digital-to-analog converter that, using the one or more second clock signals, converts the first digital value and the second digital value to produce an analog radiofrequency signal comprising a frequency ramp.

An embodiment of the presently disclosed techniques comprises a method of detecting a range at a radar frequency. The method comprises: performing a translation of a timing signal into an analog signal by generating a first cyclic digital value, truncating, using a first quantizer, first bits indicative of the first cyclic digital value to second bits indicative of a first truncated cyclic digital value, generating a first digital value based upon a first quantization error of the first quantizer and a second value, combining the first digital value with the first truncated cyclic digital value to generate a third digital value, generating, according to the timing signal, a fourth digital value based upon the third digital value, generating a second cyclic digital value, truncating using a second quantizer, third bits indicative of the second cyclic digital value to fourth bits indicative of a second truncated cyclic digital value, generating a fifth digital value based upon a second quantization error of the second quantizer and a sixth value, combining the fifth digital value with the second truncated cyclic digital value to generate a seventh digital value, generating, according to the timing signal, an eighth digital value based upon the seventh digital value, and translating the fourth digital value and the eighth digital value with a radiofrequency digital-to-analog converter to generate the analog signal, wherein the fourth digital value and/or the eighth digital value correspond to a quadrature representation of a radar modulating signal; applying the translation to generate a transmission signal at the radar frequency; and combining the transmission signal and a received signal comprising a reflection of the transmission signal to determine the range.

An embodiment of the presently disclosed techniques comprises an apparatus for detecting a range at a radar frequency. The apparatus comprises: means for performing a translation of a timing signal into an analog signal by generating a first cyclic digital value, truncating, using a first quantizer, first bits indicative of the first cyclic digital value to second bits indicative of a first truncated cyclic digital value, generating a first digital value based upon a first quantization error of the first quantizer and a second value, combining the first digital value with the first truncated cyclic digital value to generate a third digital value, generating, according to the timing signal, a fourth digital value based upon the third digital value, generating a second cyclic digital value, truncating using a second quantizer, third bits indicative of the second cyclic digital value to fourth bits indicative of a second truncated cyclic digital value, generating a fifth digital value based upon a second quantization error of the second quantizer and a sixth value, combining the fifth digital value with the second truncated cyclic digital value to generate a seventh digital value, generating, according to the timing signal, an eighth digital value based upon the seventh digital value, and translating the fourth digital value and the eighth digital value with a radiofrequency digital-to-analog converter to generate the analog signal, wherein the fourth digital value and/or the eighth digital value correspond to a quadrature representation of a radar modulating signal; means for applying the translation to generate a transmission signal at the radar frequency; and means for combining the transmission signal and a received signal comprising a reflection of the transmission signal to determine the range.

An embodiment of the presently disclosed techniques comprises a ramp generator device, comprising: a phase-locked loop that provides a timing signal; a clock generator that translates the timing signal into a plurality of clock signals comprising one or more first clock signals and one or more second clock signals; a digital ramp generator that, using the one or more first clock signals, generates a first digital value and a second digital value, wherein the digital ramp generator comprises a first quantizer that truncates first bits indicative of a first cyclic digital value to second bits indicative of a first truncated cyclic digital value, a first noise shaping module that generates a third digital value based upon a first quantization error of the first quantizer and a fourth value, a first combination module that combines the third digital value with the first truncated cyclic digital value to generate a fifth digital value, a second quantizer that truncates third bits indicative of a second cyclic digital value to fourth bits indicative of a second truncated cyclic digital value, a second noise shaping module that generates a sixth digital value based upon a second quantization error of the second quantizer and a seventh value, and a second combination module that combines the sixth digital value with the second truncated cyclic digital value to generate an eighth digital value, and wherein the first digital value is based upon the fifth digital value, the second digital value is based upon the eighth digital value, and the first digital value and/or the second digital value correspond to a quadrature representation of a ramp modulation signal; and a radiofrequency digital-to-analog converter that, using the one or more second clock signals, converts the first digital value and the second digital value to produce an analog radiofrequency signal comprising a frequency ramp.

An embodiment of the presently disclosed techniques comprises a method of detecting a range at a radar frequency. The method comprises: performing a translation of a timing signal into an analog signal by: generating, according to the timing signal, a first digital value and a second digital value that are quadrature representations of a radar modulating signal, and translating the first digital value and the second digital value with a radiofrequency digital-to-analog converter to generate the analog signal; applying the translation to generate a transmission signal at the radar frequency; and comparing the transmission signal and a received signal comprising a reflection of the transmission signal to determine a range.

An embodiment of the presently disclosed techniques comprises an apparatus for determining a range at a radar frequency. The apparatus comprises: means for performing a translation of a timing signal into an analog signal by: generating, according to the timing signal, a first digital value and a second digital value that are quadrature representations of a radar modulating signal, and translating the first digital value and the second digital value with a radiofrequency digital-to-analog converter to generate the analog signal; means for applying the translation to generate a transmission signal at the radar frequency; and means for comparing the transmission signal and a received signal comprising a reflection of the transmission signal to determine a range.

An embodiment of the presently disclosed techniques comprises a radar modulation signal generator, comprising: a phase-locked loop that provides a timing signal; a clock generator that translates the timing signal into a first clock signal and a second clock signal; a radar modulator that, at the first clock signal, generates a first digital value and a second digital value that are quadrature representations of a modulation signal at a modulation frequency; a radiofrequency digital-to-analog converter that, using the second clock signal, converts the first digital value and the second digital value to produce an analog signal; a transmitter that generates a transmission signal at the radar frequency based on the analog signal; a receiver that receives a reflection of the transmission signal; and a range determiner that compares the reflection and the transmission signal to determine a range.

An embodiment of the presently disclosed techniques comprises an apparatus for generating a ramp. The apparatus comprises: means for providing a timing signal; means for translating the timing signal into a first clock signal and a second clock signal; means for generating, at the first clock signal, a first digital value and a second digital value that are quadrature representations of a ramp modulation signal; and means for converting, using the second clock signal, the first digital value and the second digital value to produce an analog radiofrequency ramp signal.

J. USAGE OF TERMS

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of detecting a range at a radar frequency, the method comprising:
   performing a translation of a timing signal into an analog signal by:
      generating, according to the timing signal, a first digital value and a second digital value based upon a random phase value, wherein at least one of the first digital value or the second digital value corresponds to a quadrature representation of a radar modulating signal, and
      translating the first digital value and the second digital value with a radiofrequency digital-to-analog converter to generate the analog signal;
   applying the translation to generate a transmission signal at the radar frequency; and
   combining the transmission signal and a received signal comprising a reflection of the transmission signal to determine the range.

2. The method of claim 1, wherein generating the first digital value and the second digital value comprises:
   combining the random phase value with a first cyclic digital value to generate a third digital value, wherein the first digital value is based upon the third digital value; and
   combining the random phase value with a second cyclic digital value to generate a fourth digital value, wherein the second digital value is based upon the fourth digital value.

3. The method of claim 2, wherein generating the first digital value and the second digital value comprises:
   generating the first digital value as a sine of the third digital value; and
   generating the second digital value as a cosine of the fourth digital value.

4. The method of claim 2, wherein generating the first digital value and the second digital value comprises:
   generating an increasing digital value;
   integrating the increasing digital value using a first integrator to generate the first cyclic digital value; and
   integrating the increasing digital value using a second integrator to generate the second cyclic digital value.

5. The method of claim 2, wherein:
   the radar modulating signal comprises a frequency ramp;
   the random phase value is a random initial phase value; and
   combining the random phase value with the first cyclic digital value and combining the random phase value with the second cyclic digital value are performed at a start of the frequency ramp.

6. The method of claim 1, wherein:
   the radar modulating signal comprises a frequency ramp.

7. A ramp generator device comprising:
   a phase-locked loop that provides a timing signal;
   a clock generator that translates the timing signal into a plurality of clock signals comprising one or more first clock signals and one or more second clock signals;
   a digital ramp generator that, using the one or more first clock signals, generates a first digital value and a second digital value based upon a random phase value, wherein at least one of the first digital value or the second digital value corresponds to a quadrature representation of a ramp modulation signal; and
   a radiofrequency digital-to-analog converter that, using the one or more second clock signals, converts the first digital value and the second digital value to produce an analog radiofrequency signal comprising a frequency ramp.

8. The ramp generator device of claim 7, wherein the digital ramp generator comprises:
   a first combination module that combines the random phase value with a first cyclic digital value to generate a third digital value, wherein the first digital value is based upon the third digital value; and
   a second combination module that combines the random phase value with a second cyclic digital value to generate a fourth digital value, wherein the second digital value is based upon the fourth digital value.

9. The ramp generator device of claim 8, wherein the digital ramp generator comprises:
   a first digital generator that generates the first digital value as a sine of the third digital value; and
   a second digital generator that generates the second digital value as a cosine of the fourth digital value.

10. The ramp generator device of claim 8, wherein the digital ramp generator comprises:
    a first integrator that generates an increasing digital value;
    a second integrator that integrates the increasing digital value to generate the first cyclic digital value; and
    a third integrator that integrates the increasing digital value to generate the second cyclic digital value.

11. The ramp generator device of claim 8, wherein:
    the random phase value is a random initial phase value; and
    the first combination module combines the random phase value with the first cyclic digital value and the second combination module combines the random phase value with the second cyclic digital value at a start of the frequency ramp.

12. A method of detecting a range at a radar frequency, the method comprising:
    performing a translation of a timing signal into an analog signal by:
       generating a first cyclic digital value;
       truncating, using a first quantizer, first bits indicative of the first cyclic digital value to second bits indicative of a first truncated cyclic digital value;
       generating a first digital value based upon a first quantization error of the first quantizer and a second value;
       combining the first digital value with the first truncated cyclic digital value to generate a third digital value;
       generating, according to the timing signal, a fourth digital value based upon the third digital value;
       generating a second cyclic digital value;
       truncating using a second quantizer, third bits indicative of the second cyclic digital value to fourth bits indicative of a second truncated cyclic digital value;
       generating a fifth digital value based upon a second quantization error of the second quantizer and a sixth value;
       combining the fifth digital value with the second truncated cyclic digital value to generate a seventh digital value;
       generating, according to the timing signal, an eighth digital value based upon the seventh digital value, wherein at least one of the fourth digital value or the eighth digital value corresponds to a quadrature representation of a radar modulating signal; and translating the fourth digital value and the eighth digital value with a radiofrequency digital-to-analog converter to generate the analog signal;

applying the translation to generate a transmission signal at the radar frequency; and combining the transmission signal and a received signal comprising a reflection of the transmission signal to determine the range.

13. The method of claim 12, comprising:
generating an increasing digital value, wherein:
   generating the first cyclic digital value comprises integrating the increasing digital value using a first integrator to generate the first cyclic digital value; and
   generating the second cyclic digital value comprises integrating the increasing digital value using a second integrator to generate the second cyclic digital value.

14. The method of claim 12, wherein:
generating the fourth digital value comprises generating the fourth digital value as a sine of the third digital value; and
generating the eighth digital value comprises generating the eighth digital value as a cosine of the seventh digital value.

15. The method of claim 12, wherein:
the second value is at least one of a first random value or a first noise shaped value; and
the sixth value is at least one of a second random value or a second noise shaped value.

16. A ramp generator device comprising:
a phase-locked loop that provides a timing signal;
a clock generator that translates the timing signal into a plurality of clock signals comprising one or more first clock signals and one or more second clock signals;
a digital ramp generator that, using the one or more first clock signals, generates a first digital value and a second digital value, wherein:
   the digital ramp generator comprises:
      a first quantizer that truncates first bits indicative of a first cyclic digital value to second bits indicative of a first truncated cyclic digital value;
      a first noise shaping module that generates a third digital value based upon a first quantization error of the first quantizer and a fourth value;
      a first combination module that combines the third digital value with the first truncated cyclic digital value to generate a fifth digital value;
      a second quantizer that truncates third bits indicative of a second cyclic digital value to fourth bits indicative of a second truncated cyclic digital value;
      a second noise shaping module that generates a sixth digital value based upon a second quantization error of the second quantizer and a seventh value; and
      a second combination module that combines the sixth digital value with the second truncated cyclic digital value to generate an eighth digital value;
   the first digital value is based upon the fifth digital value;
   the second digital value is based upon the eighth digital value; and
   at least one of the first digital value or the second digital value corresponds to a quadrature representation of a ramp modulation signal; and
a radiofrequency digital-to-analog converter that, using the one or more second clock signals, converts the first digital value and the second digital value to produce an analog radiofrequency signal comprising a frequency ramp.

17. The ramp generator device of claim 16, wherein the digital ramp generator comprises:
a first integrator that generates an increasing digital value; and
a second integrator that integrates the increasing digital value to generate the first cyclic digital value; and
a third integrator that integrates the increasing digital value to generate the second cyclic digital value.

18. The ramp generator device of claim 16, wherein the digital ramp generator comprises:
a first digital generator that generates the first digital value as a sine of the fifth digital value; and
a second digital generator that generates the second digital value as a cosine of the eighth digital value.

19. The ramp generator device of claim 16, wherein:
the fourth value is a first random value; and
the seventh value is a second random value.

20. The ramp generator device of claim 16, wherein:
the fourth value is a first noise shaped value; and
the seventh value is a second noise shaped value.

* * * * *